US012721015B2

(12) United States Patent
Liu

(10) Patent No.: US 12,721,015 B2
(45) Date of Patent: Aug. 25, 2026

(54) LIGHT-EMITTING SUBSTRATE AND MANUFACTURING METHOD THEREFOR, DISPLAY APPARATUS

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventor: Tongzhi Liu, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 376 days.

(21) Appl. No.: 18/293,584

(22) PCT Filed: Apr. 24, 2023

(86) PCT No.: PCT/CN2023/090382
§ 371 (c)(1),
(2) Date: Jan. 30, 2024

(87) PCT Pub. No.: WO2024/221188
PCT Pub. Date: Oct. 31, 2024

(65) Prior Publication Data
US 2025/0113719 A1 Apr. 3, 2025

(51) Int. Cl.
*H10K 59/80* (2023.01)
*C09K 11/02* (2006.01)
(Continued)

(52) U.S. Cl.
CPC ............ *H10K 59/879* (2023.02); *C09K 11/02* (2013.01); *C09K 11/06* (2013.01); *H10K 85/346* (2023.02);
(Continued)

(58) Field of Classification Search
CPC .. H10K 59/879; H10K 85/346; H10K 85/658; H10K 2102/3026; H10K 50/858;
(Continued)

(56) References Cited

U.S. PATENT DOCUMENTS 9,711,745 B2 * 7/2017 Yamazaki .............. H10K 50/11
2009/0033201 A1 * 2/2009 Shimooka .......... C09K 11/0883
423/385
(Continued)

FOREIGN PATENT DOCUMENTS

CN 106876432 A 6/2017
CN 107546331 A 1/2018
(Continued)

*Primary Examiner* — Caleb E Henry
(74) *Attorney, Agent, or Firm* — The Webb Law Firm

(57) ABSTRACT

A light-emitting substrate includes a base substrate, a light-emitting unit and a light extraction member arranged in sequence. The light-emitting unit includes at least one blue light-emitting device, a first light enhancement layer and a second light enhancement layer arranged in sequence. A blue light-emitting device includes a first electrode, at least one blue light-emitting layer and a second electrode sequentially stacked. An orthographic projection of the light extraction member on the base substrate at least partially overlaps with an orthographic projection of the blue light-emitting device on the base substrate. An absolute value of a difference between a wavelength corresponding to a transmittance peak of the light extraction member and a wavelength corresponding to an emission spectrum peak of the blue light-emitting device is less than or equal to 10 nm.

20 Claims, 13 Drawing Sheets

(51) Int. Cl.
*C09K 11/06* (2006.01)
*H10K 85/30* (2023.01)
*H10K 85/60* (2023.01)
*H10K 102/00* (2023.01)

(52) U.S. Cl.
CPC .... *H10K 85/658* (2023.02); *C09K 2211/1018* (2013.01); *C09K 2211/185* (2013.01); *H10K 2102/3026* (2023.02)

(58) Field of Classification Search
CPC ........ H10K 59/12; C09K 11/02; C09K 11/06; C09K 2211/1018; C09K 2211/185
See application file for complete search history.

(56) References Cited

U.S. PATENT DOCUMENTS

| | | | | |
|---|---|---|---|---|
| 2009/0140205 | A1* | 6/2009 | Kijima | C04B 35/6262 252/301.4 F |
| 2010/0164365 | A1* | 7/2010 | Yoshino | C09K 11/7734 313/503 |
| 2010/0213822 | A1* | 8/2010 | Shimooka | C09K 11/0883 313/503 |
| 2015/0340410 | A1* | 11/2015 | Hack | H10K 59/876 438/35 |
| 2016/0126463 | A1* | 5/2016 | Kadoma | C07D 209/86 548/445 |
| 2016/0372688 | A1* | 12/2016 | Seo | C07F 15/0033 |
| 2017/0146856 | A1* | 5/2017 | Yokota | G02F 1/133514 |
| 2017/0207281 | A1* | 7/2017 | Hack | H10K 59/876 |
| 2017/0294628 | A1* | 10/2017 | Kim | H10K 59/873 |
| 2017/0317306 | A1* | 11/2017 | Ishisone | C09K 11/06 |
| 2018/0301514 | A1* | 10/2018 | Li | H10K 85/50 |
| 2019/0280055 | A1* | 9/2019 | Hack | H10K 59/30 |
| 2019/0386234 | A1* | 12/2019 | Cheng | H10K 50/165 |
| 2020/0075896 | A1* | 3/2020 | Muramatsu | G02B 5/3016 |
| 2021/0202876 | A1* | 7/2021 | Kim | H10K 50/121 |
| 2021/0390923 | A1* | 12/2021 | Kawashima | G09G 3/3648 |
| 2022/0006057 | A1* | 1/2022 | Itonaga | G03B 21/005 |
| 2022/0051639 | A1* | 2/2022 | Kawashima | G09G 3/3688 |
| 2022/0102648 | A1* | 3/2022 | Wang | H10K 85/6572 |
| 2022/0108666 | A1* | 4/2022 | Watanabe | G09G 3/3677 |
| 2022/0376210 | A1* | 11/2022 | Wu | G02F 1/133603 |
| 2022/0384398 | A1* | 12/2022 | Yamazaki | H10K 59/18 |
| 2022/0407037 | A1* | 12/2022 | Itonaga | H04N 9/3138 |
| 2022/0416190 | A1* | 12/2022 | Zhang | H10K 50/11 |
| 2023/0269957 | A1* | 8/2023 | Qiu | H10K 59/35 257/40 |
| 2023/0345752 | A1* | 10/2023 | Zhang | H10K 59/10 |
| 2024/0130229 | A1* | 4/2024 | Narukawa | H10K 85/626 |
| 2024/0172460 | A1* | 5/2024 | Osaka | H10K 85/6574 |
| 2024/0172461 | A1* | 5/2024 | Osaka | H10K 85/6572 |
| 2024/0188318 | A1* | 6/2024 | Zhang | H10K 85/00 |
| 2024/0188404 | A1* | 6/2024 | Yamazaki | H10K 59/95 |
| 2024/0206296 | A1* | 6/2024 | Zhang | H10K 59/879 |
| 2024/0206303 | A1* | 6/2024 | Sun | H10K 59/8791 |
| 2024/0251584 | A1* | 7/2024 | Kim | H10K 85/6576 |
| 2024/0260287 | A1* | 8/2024 | Kubota | H05B 33/12 |
| 2024/0334817 | A1* | 10/2024 | Qiu | H10K 85/623 |

FOREIGN PATENT DOCUMENTS

| | | | |
|---|---|---|---|
| CN | 108807481 | A | 11/2018 |
| CN | 111613735 | A | 9/2020 |
| CN | 115064647 | A | 9/2022 |
| JP | 2005149945 | A | 6/2005 |
| JP | 2016149372 | A | 8/2016 |
| KR | 1020180112925 | A | 10/2018 |
| WO | 2022110113 | A1 | 6/2022 |
| WO | 2022217600 | A1 | 10/2022 |
| WO | 2023028787 | A1 | 3/2023 |
| WO | 2023028788 | A1 | 3/2023 |

* cited by examiner

LIGHT-EMITTING SUBSTRATE AND MANUFACTURING METHOD THEREFOR, DISPLAY APPARATUS

CROSS-REFERENCE TO RELATED APPLICATION

This application is the United States national phase of International Application No. PCT/CN2023/090382, filed Apr. 24, 2023, the disclosure of which is hereby incorporated by reference in its entirety.

BACKGROUND OF THE INVENTION

Field of the Invention

The present disclosure relates to the field of display technologies, and in particular, to a light-emitting substrate and a manufacturing method therefor, and a display apparatus.

Description of Related Art

At present, organic light-emitting diode (OLED) display apparatuses have the advantages of self-illumination, high luminous efficiency, energy saving, good flexibility, and adaptability to a wide range of ambient temperature, and therefore are widely used in various occasions. In the blue light-emitting device of the OLED display apparatus, the light-emitting material of the blue light-emitting layer may be a blue phosphorescent material or a blue fluorescent material. The blue fluorescent material has a better stability than the blue phosphorescent material, so that the blue fluorescent material is more widely used in the blue light-emitting layer of OLED display apparatus.

SUMMARY OF THE INVENTION

In an aspect, a light-emitting substrate is provided. The light-emitting substrate is a top-emission light-emitting substrate. The light-emitting substrate includes a base substrate, a light-emitting unit and a light extraction member. The light-emitting unit is located on a side of the base substrate. The light-emitting unit includes at least one blue light-emitting device. A blue light-emitting device includes a first electrode, at least one blue light-emitting layer and a second electrode that are sequentially stacked in a direction away from the base substrate. The light-emitting unit further includes a first light enhancement layer and a second light enhancement layer that are located on a side of the blue light-emitting device away from the base substrate. The first light enhancement layer is located between the blue light-emitting device and the second light enhancement layer. The second light enhancement layer includes a first inorganic layer, an organic layer and a second inorganic layer that are sequentially stacked in a direction in which the first light enhancement layer is away from the base substrate. Refractive index of the organic layer is less than refractive index of the first inorganic layer and less than refractive index of the second inorganic layer. The light extraction member is located on a side of the second light enhancement layer away from the base substrate. An orthographic projection of the light extraction member on the base substrate at least partially overlaps with an orthographic projection of the blue light-emitting device on the base substrate. An absolute value of a difference between a wavelength corresponding to a transmittance peak of the light extraction member and a wavelength corresponding to an emission spectrum peak of the blue light-emitting device is less than or equal to 10 nm.

In some embodiments, the absolute value of the difference between the wavelength corresponding to the transmittance peak of the light extraction member and the wavelength corresponding to the emission spectrum peak of the blue light-emitting device is less than or equal to 3 nm.

In some embodiments, the orthographic projection of the light extraction member on the base substrate covers an orthographic projection of a light-emitting portion of the blue light-emitting device on the base substrate.

In some examples, the light extraction member is a cholesteric liquid crystal film layer.

In some embodiments, the second light enhancement layer further includes a third inorganic layer, and the third inorganic layer is disposed between the first light enhancement layer and the first inorganic layer; refractive index of the third inorganic layer is less than refractive index of the first light enhancement layer and less than the refractive index of the first inorganic layer.

In some embodiments, a blue light-emitting layer includes a first host material and a first guest material; in the blue light-emitting layer, a ratio of electron mobility of the first host material to hole mobility of the first host material is greater than or equal to 80.

In some embodiments, the first guest material is a metal complex including any one of metal element iridium, platinum, palladium or cerium and at least two nitrogen heterocyclic carbene ligands.

In some embodiments, in the blue light-emitting layer, triplet energy level of the first host material is greater than triplet energy level of the first guest material.

In some embodiments, a blue light-emitting layer includes a second host material, a sensitizer and a second guest material; in the blue light-emitting layer, a ratio of electron mobility of the second host material to hole mobility of the second host material is less than or equal to 0.2.

In some embodiments, a ratio of electron mobility of the sensitizer to hole mobility of the sensitizer is greater than or equal to 8.

In some embodiments, an absolute value of a difference between singlet energy level of the sensitizer and triplet energy level of the sensitizer is less than or equal to 0.5 eV.

In some embodiments, a proportion of a weight of the sensitizer to a sum of a weight of the second host material and the weight of the sensitizer is less than or equal to 30%.

In some embodiments, a ratio of a weight of the second guest material to a sum of a weight of the second host material and a weight of the sensitizer is less than or equal to 5%.

In some embodiments, a proportion of an overlapping area between an absorption spectrum of the second guest material and an emission spectrum of the sensitizer to an area of the emission spectrum of the sensitizer is greater than or equal to 8%.

In some embodiments, a proportion of an overlapping area between an absorption spectrum of the second guest material and an emission spectrum of the sensitizer to an area of the emission spectrum of the sensitizer is less than or equal to 80%.

In some embodiments, the second guest material is selected from any one of structures represented by the following general formula.

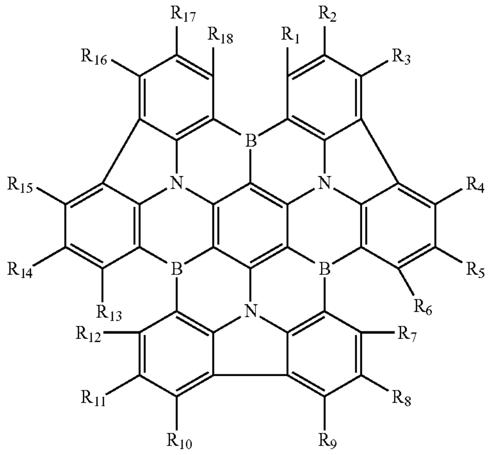

Substituent groups $R_1$ to $R_{18}$ are the same or different, and are independently selected from any one of hydrogen, alkyl, aryl or heteroaryl; adjacent substituent groups $R_1$ to $R_{18}$ form a fused ring or form no fused ring.

In some embodiments, the wavelength corresponding to the emission spectrum peak of the blue light-emitting device is in a range of 440 nm to 480 nm, inclusive, and full width at half maximum of the emission spectrum of the blue light-emitting device is less than or equal to 50 nm.

In some embodiments, the light-emitting substrate further includes an anti-reflection layer disposed on a side of the light extraction member away from the base substrate.

In another aspect, a manufacturing method for a light-emitting substrate is provided. The light-emitting substrate is a top-emission light-emitting substrate. The manufacturing method includes: providing a base substrate; forming a light-emitting unit on a side of the base substrate, wherein the light-emitting unit includes at least one blue light-emitting device; a blue light-emitting device includes a first electrode, at least one blue light-emitting layer and a second electrode that are sequentially stacked in a direction away from the base substrate; the light-emitting unit further includes a first light enhancement layer and a second light enhancement layer that are located on a side of the blue light-emitting device away from the base substrate, the first light enhancement layer is located between the blue light-emitting device and the second light enhancement layer; the second light enhancement layer includes a first inorganic layer, an organic layer and a second inorganic layer that are sequentially stacked in a direction in which the first light enhancement layer is away from the base substrate, and refractive index of the organic layer is less than refractive index of the first inorganic layer and less than refractive index of the second inorganic layer; and forming a light extraction member on a side of the second light enhancement layer away from the base substrate, wherein an orthographic projection of the light extraction member on the base substrate at least partially overlaps with an orthographic projection of the blue light-emitting device on the base substrate; an absolute value of a difference between a wavelength corresponding to a transmittance peak of the light extraction member and a wavelength corresponding to an emission spectrum peak of the blue light-emitting device is less than or equal to 10 nm.

In yet another aspect, a display apparatus is provided. The display apparatus includes a circuit board, and the light-emitting substrate according to any one of the above embodiments. The light-emitting substrate is coupled to the circuit board.

BRIEF DESCRIPTION OF THE DRAWINGS

In order to describe technical solutions in the present disclosure more clearly, the accompanying drawings to be used in some embodiments of the present disclosure will be introduced briefly. Obviously, the accompanying drawings to be described below are merely drawings of some embodiments of the present disclosure, and a person of ordinary skill in the art can obtain other drawings according to those drawings. In addition, the accompanying drawings in the following description may be regarded as schematic diagrams, but are not limitations on actual sizes of products, actual processes of methods and actual timings of signals involved in the embodiments of the present disclosure.

DESCRIPTION OF THE INVENTION

Figure 1:
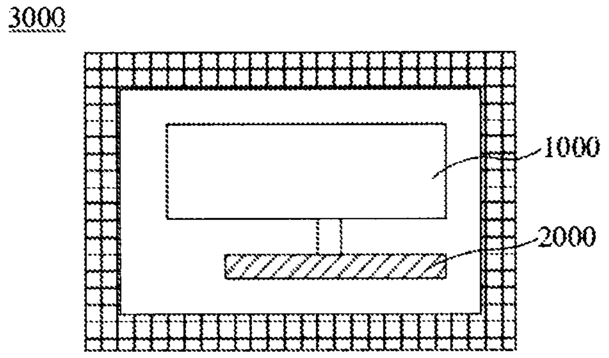
FIG. 1 is a structural diagram of a display apparatus, in accordance with some embodiments.

The technical solutions in some embodiments of the present disclosure will be described clearly and completely with reference to the accompanying drawings. Obviously, the described embodiments are merely some but not all embodiments of the present disclosure. All other embodiments obtained by a person of ordinary skill in the art based on embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example", or "some examples" are intended to indicate that specific features, structures, materials, or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

The terms "first" and "second" are used for descriptive purposes only, and are not to be construed as indicating or implying a relative importance or implicitly indicating a number of indicated technical features. Thus, a feature defined with "first" or "second" may explicitly or implicitly include one or more of the features. In the description of the embodiments of the present disclosure, the term "a plurality of" or "the plurality of" means two or more unless otherwise specified.

In the description of some embodiments, the expressions "coupled", "connected", and derivatives thereof may be used. The term "connected" should be understood in a broad sense. For example, the term "connected" may represent a fixed connection, a detachable connection, or a one-piece connection, or may represent a direct connection, or may represent an indirect connection through an intermediate medium. The term "coupled" indicates, for example, that two or more components are in direct physical or electrical contact with each other. The term "coupled" or "communicatively coupled" may also mean that two or more components are not in direct contact with each other but still cooperate or interact with each other. The embodiments disclosed herein are not necessarily limited to the content herein.

The phrase "at least one of A, B, and C" has the same meaning as the phrase "at least one of A, B, or C", both including the following combinations of A, B, and C: only A, only B, only C, a combination of A and B, a combination of A and C, a combination of B and C, and a combination of A, B, and C.

The phrase "A and/or B" includes following three combinations: only A, only B, and a combination of A and B.

As used herein, the term "if" is, optionally, construed as "when" or "in a case where" or "in response to determining that" or "in response to detecting," depending on the context. Similarly, depending on the context, the phrase "if it is determined that" or "if [a stated condition or event] is detected" is optionally construed as "in a case where it is determined that" or "in response to determining that" or "in a case where [the stated condition or event] is detected" or "in response to detecting [the stated condition or event]."

The use of the phrase "applicable to" or "configured to" herein means an open and inclusive expression, which does not exclude devices that are applicable to or configured to perform additional tasks or steps.

Additionally, the use of the phase "based on" is meant to be open and inclusive, since a process, step, calculation or other action that is "based on" one or more of the stated conditions or values may, in practice, be based on additional conditions or value beyond those stated.

The term such as "about," "substantially," and "approximately" as used herein includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

The term such as "parallel," "perpendicular," or "equal" as used herein includes a stated condition and a condition similar to the stated condition. A range of the similar condition is within an acceptable deviation range, and the acceptable deviation range is determined by a person of ordinary skill in the art, considering measurement in question and errors associated with measurement of a particular quantity (i.e., the limitations of a measurement system). For example, the term "parallel" includes absolute parallelism and approximate parallelism, and an acceptable range of deviation of the approximate parallelism may be, for example, a deviation within 5°; the term "perpendicular" includes absolute perpendicularity and approximate perpendicularity, and an acceptable range of deviation of the approximate perpendicularity may also be, for example, a deviation within 5°; and the term "equal" includes absolute equality and approximate equality, and an acceptable range of deviation of the approximate equality may be, for example, that a difference between two equals is less than or equal to 5% of either of the two equals.

It will be understood that, when a layer or element is referred to as being on another layer or substrate, it may be that the layer or element is directly on the another layer or substrate, or it may be that intervening layer(s) exist between the layer or element and the another layer or substrate.

Exemplary embodiments are described herein with reference to sectional views and/or plan views that are schematic illustrations of idealized embodiments. In the accompanying drawings, thicknesses of layers and areas of regions are enlarged for clarity. Thus, variations in shape with respect to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown to have a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Currently, in the blue light-emitting layer of the OLED display apparatus, due to the poor stability and short service life of the blue phosphorescent material, while the blue fluorescent material has good stability, the blue fluorescent material is more widely used in the blue light-emitting layer of OLED display apparatus.

However, the inventors of the present disclosure found through research that, in blue light-emitting devices, the exciton utilization rate of the blue fluorescent material is low, resulting in low luminous efficiency of the blue light-emitting devices in the light-emitting substrate. In order to increase the amount of light emitted by the blue light-emitting device, the operating load (including operating current and/or operating voltage) of the blue light-emitting device needs to be increased. Due to the leakage current between adjacent light-emitting devices, a large operating load will make the red light-emitting device and/or green light-emitting device adjacent to the blue light-emitting device easy to light up, resulting in an additionally increase of the display light of other colors, and a decrease of the color display effect of the light-emitting substrate.

In light of this, some embodiments of the present disclosure provide a display substrate and a method for manufacturing the same, and a display apparatus to overcome the above problems. The following will be introduced, respectively.

FIG. 1 is a structural diagram of a display apparatus, in accordance with some embodiments.

Referring to FIG. 1, some embodiments of the present disclosure provide a display apparatus 3000. The display apparatus 3000 may be used to display images or pictures. For example, the display apparatus 3000 may be a small and medium sized display apparatus such as a tablet computer, a smart phone, a head-mounted display, an automobile navigation unit, a camera, a central information display (CID) provided in a vehicle, a wristwatch-type electronic apparatus or any other wearable device, a personal digital assistant (PDA), a portable multimedia player (PMP) and a game console, and a medium and large sized electronic apparatus such as a television, an external billboard, a monitor, a home appliance including a display screen, a personal computer and a laptop computer. The electronic apparatus described above may represent an example of the display apparatus, so a person of ordinary skill in the art can recognize that the display apparatus 3000 may be any other electronic apparatus without departing from the spirit and scope of the present disclosure.

As shown in FIG. 1, the display apparatus 3000 includes a light-emitting substrate 1000 and a circuit board 2000, and the light-emitting substrate 1000 is coupled to the circuit board 2000. The circuit board 2000 is located on a backlight side (i.e., a side opposite to a display side of the light-emitting substrate 1000) of the light-emitting substrate 1000. For example, the circuit board 2000 may be a flexible printed circuit board (FPC) or a printed circuit board. The circuit board 2000 can provide a light-emitting data signal, and the light-emitting substrate 1000 emits light based on the light-emitting data signal provided by the circuit board 2000.

Figure 2:
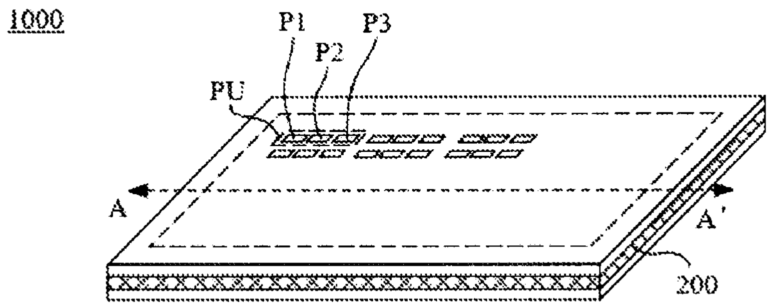
FIG. 2 is a structural diagram of a light-emitting substrate, in accordance with some embodiments.
Figure 3:
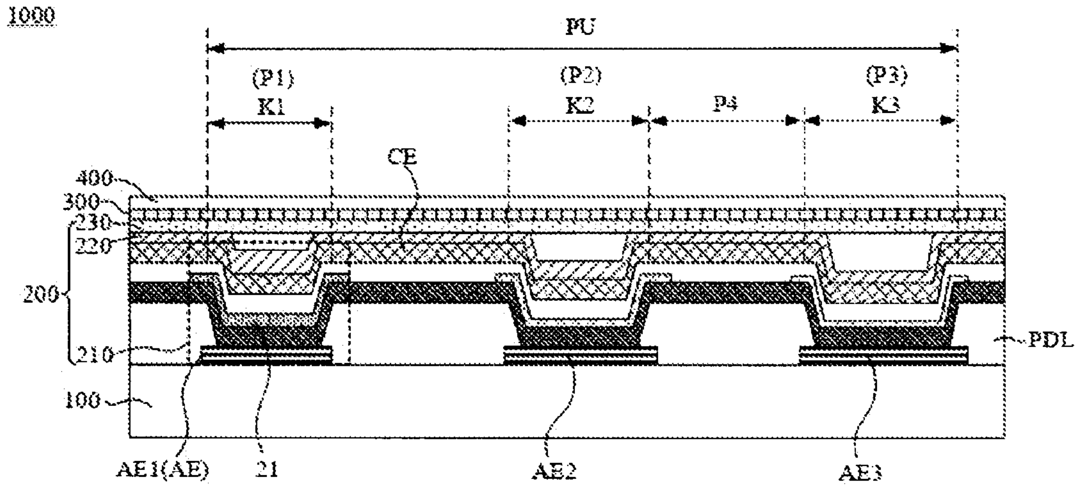
FIG. 3 is a sectional view of the light-emitting substrate shown in the embodiments of FIG. 2 taken along the line A-A'.

FIG. 2 is a structural diagram of a light-emitting substrate, in accordance with some embodiments of the present disclosure. FIG. 3 is a sectional view of the light-emitting substrate shown in the embodiments of FIG. 2 taken along the line A-A'.

Referring to FIGS. 2 and 3, some embodiments of the present disclosure provide a light-emitting substrate 1000. The light-emitting substrate 1000 is a display component capable of emitting light. The light-emitting substrate 1000 can emit monochromatic light (light of a single color) or colored light. The light-emitting substrate 1000 is applied to the display apparatus 3000, or a lighting device.

In some embodiments, as shown in FIG. 3, the light-emitting substrate 1000 may be a top-emission light-emitting substrate, which can be understood that a direction of emitting light by the light-emitting substrate 1000 is toward the display side of the light-emitting substrate 1000.

The light-emitting substrate 1000 includes a base substrate 100, light-emitting units 200, and a light extraction member 300. The light-emitting units 200 are located on a side of the base substrate 100, and the light extraction member 300 is located on a side of the light-emitting units 200 away from the base substrate 100. The light emitted from the light-emitting unit 200 can pass through the light extraction member 300 and an anti-reflection layer 400 in sequence to the outside of the light-emitting substrate 1000.

The following are detailed descriptions for the base substrate 100, the light-emitting units 200 and the light extraction member 300 in the light-emitting substrate 1000 respectively.

As shown in FIG. 3, the base substrate 100 includes a plurality of pixel unit regions PU arranged repeatedly. Each pixel unit region PU may include first sub-pixel region(s) P1, second sub-pixel region(s) P2 and third sub-pixel region(s) P3 that display different colors. For example, the first sub-pixel region P1 is configured to display blue light, the second sub-pixel region P2 is configured to display green light, and the third sub-pixel region P3 is configured to display red light.

In addition, the pixel unit region PU may further include a non-light-emitting region P4. The non-light-emitting region P4 may be located between the first sub-pixel region P1 and the second sub-pixel region P2, between the second sub-pixel region P2 and the third sub-pixel region P3, and between the third sub-pixel region P3 and the first sub-pixel region P1.

FIGS. 4 to 8 are respectively arrangement structure diagrams of sub-pixels in the light-emitting substrate, in accordance with some embodiments.

Figure 4:
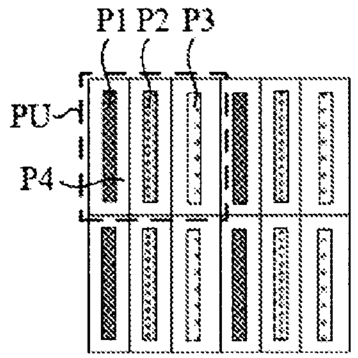
FIGS. 4 to 8 are respectively arrangement structure diagrams of sub-pixels in a light-emitting substrate, in accordance with some embodiments.
Figure 5:
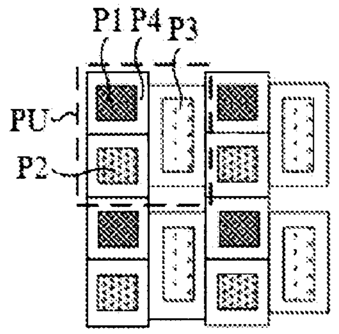
Figure 6:
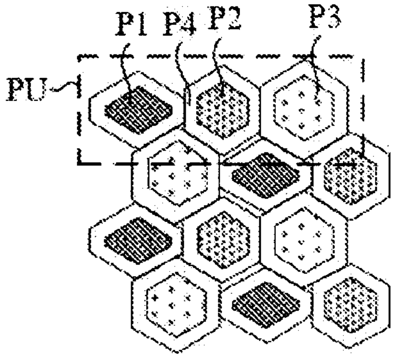

In some examples, as shown in FIGS. 4 to 6, the pixel unit region PU includes one first sub-pixel region P1, one second sub-pixel region P2 and one third sub-pixel region P3. The first sub-pixel region P1, the second sub-pixel region P2 and the third sub-pixel region P3 are arranged at intervals, and they are repeatedly arranged.

Figure 7:
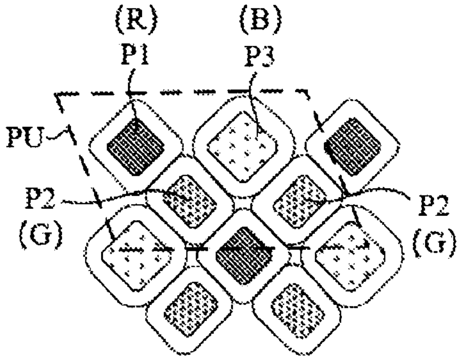
Figure 8:
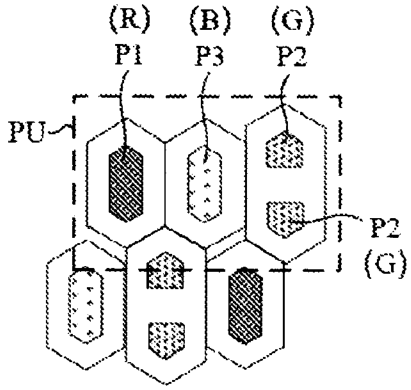

In some examples, as shown in FIGS. 7 and 8, the pixel unit region PU may include two sub-pixel regions displaying the same color, and the two sub-pixel regions displaying the same color may be adjacently arranged. For example, the pixel unit region PU includes one red sub-pixel region R, two green sub-pixel regions G and one blue sub-pixel region B, and the two green sub-pixel regions G in the pixel unit region PU are adjacently arranged.

In some examples, the pixel unit region PU includes one first sub-pixel region P1, two second sub-pixel regions P2 and one third sub-pixel region P3. The one first sub-pixel region P1, the two second sub-pixel regions P2 and the one third sub-pixel region P3 are arranged at intervals, and they are repeatedly arranged. In this case, the non-light-emitting region P4 may also be located between the two second sub-pixel regions P2.

Figure 9A:
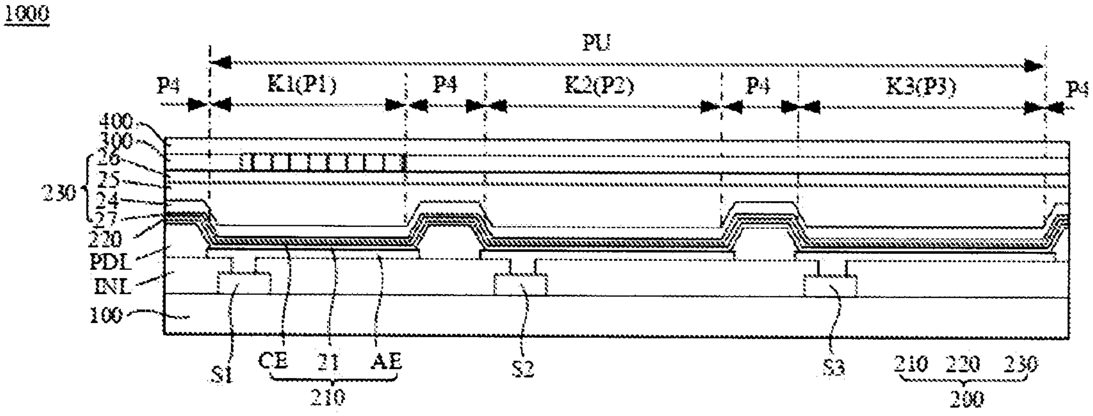
FIGS. 9A to 9C are respectively sectional views of the light-emitting substrate in FIG. 2 taken along the line AA', in accordance with some embodiments.
Figure 9B:
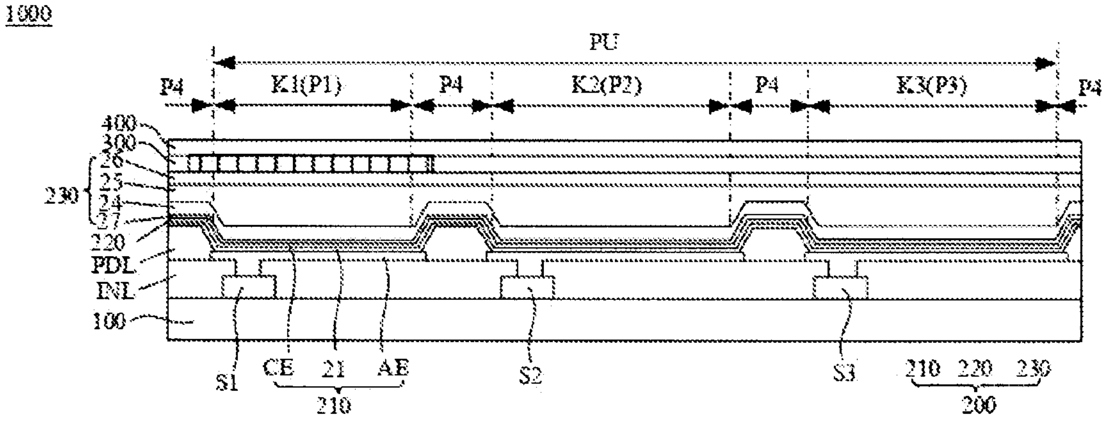
Figure 9C:
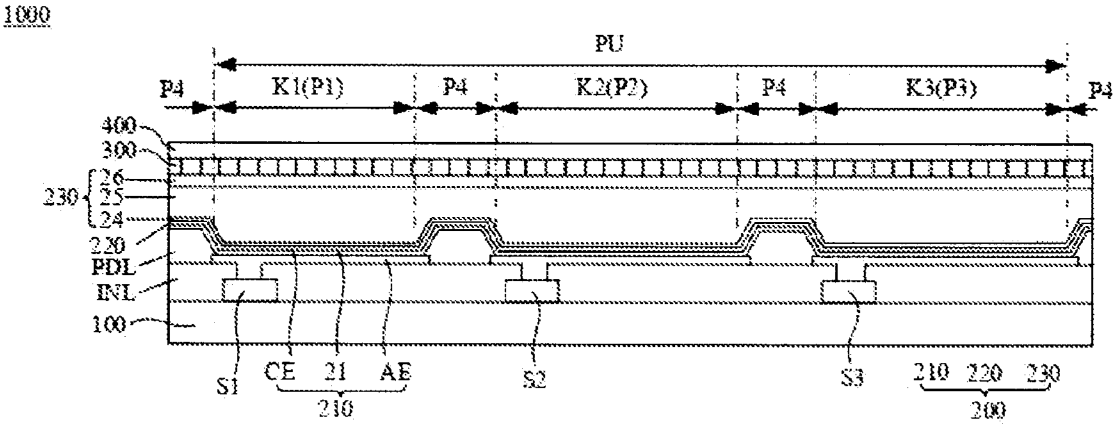

FIGS. 9A to 9C are respectively sectional views of the light-emitting substrate in FIG. 2 taken along the line AA', in accordance with some embodiments.

As shown in FIGS. 9A to 9C, the light-emitting substrate 1000 may include a plurality of pixel circuits located on the base substrate 100. A first pixel circuit S1, a second pixel circuit S2 and a third pixel circuit S3 may be included in the pixel unit region PU. For example, the first pixel circuit S1 is located in the first sub-pixel region P1, the second pixel circuit S2 is located in the second sub-pixel region P2, and the third pixel circuit S3 is located in the third sub-pixel region P3. As another example, thin film transistors in at least one of the first pixel circuit S1, the second pixel circuit S2, and the third pixel circuit S3 may be located in the non-light-emitting region P4.

The structure of the pixel circuit varies, which may be set according to actual needs. For example, the pixel circuit may include at least two transistors and at least one capacitor. For example, the pixel circuit may have a "2T1C" structure, a "6T1C" structure, a "7T1C" structure, a "6T2C" structure, a "7T2C" structure, or the like. "T" represents a thin film transistor, the number before "T" represents the number of thin film transistors, "C" represents a storage capacitor, and the number before "C" represents the number of storage capacitors.

As shown in FIGS. 9A to 9C, thin film transistors in at least one of the first pixel circuit S1, the second pixel circuit S2 and the third pixel circuit S3 may be thin film transistors including polysilicon or thin film transistors including oxide semiconductors. For example, in the case where the thin film transistors are the thin film transistors including the oxide semiconductors, the thin film transistor may have a top-gate thin film transistor structure. The thin film transistor can be connected to the signal line, and the signal line is, but not limited to, a gate line, a data line and a power supply line.

As shown in FIGS. 9A to 9C, the light-emitting substrate 1000 may include an insulating layer INL, and the insulating layer INL is located on the first pixel circuit S1, second pixel circuit S2 and third pixel circuit S3. The insulating layer INL may have a flat surface. The insulating layer INL may be formed from an organic layer. For example, a material of the insulating layer INL includes acrylic resin, epoxy resin, imide resin or ester resin. The insulating layer INL may have through holes for exposing electrodes of the first pixel circuit S1, the second pixel circuit S2 and the third pixel circuit S3, so as to achieve electrical connection.

As shown in FIGS. 9A and 9C, the light-emitting substrate 1000 includes a pixel definition layer PDL located on the base substrate 100. The pixel definition layer PDL may be formed on the insulating layer INL, and the pixel definition layer PDL may be provided with a plurality of light-emitting openings therein. For example, the pixel definition layer PDL includes a first light-emitting opening K1 located in the first sub-pixel region P1, a second light-emitting opening K2 located in the second sub-pixel region P2, and a third light-emitting opening K3 located in the third sub-pixel region P3.

The light-emitting unit 200 may be located on a side of the insulating layer INL away from the base substrate 100. The light-emitting unit 200 may include a plurality of light-emitting devices, the plurality of light-emitting devices respectively cover the plurality of light-emitting openings, and the plurality of light-emitting devices are connected to the plurality of pixel circuits in one-to-one correspondence. The plurality of light-emitting devices include at least one blue light-emitting device 210. For example, in one pixel unit region PU of the light-emitting unit 200, the light-emitting devices include one red light-emitting device, one green light-emitting device, and one blue light-emitting device 210. The blue light-emitting device 210 may cover the first light-emitting opening K1, the green light-emitting device may cover the second light-emitting opening K2, and the red light-emitting device may cover the third light-emitting opening K3.

Figure 10:
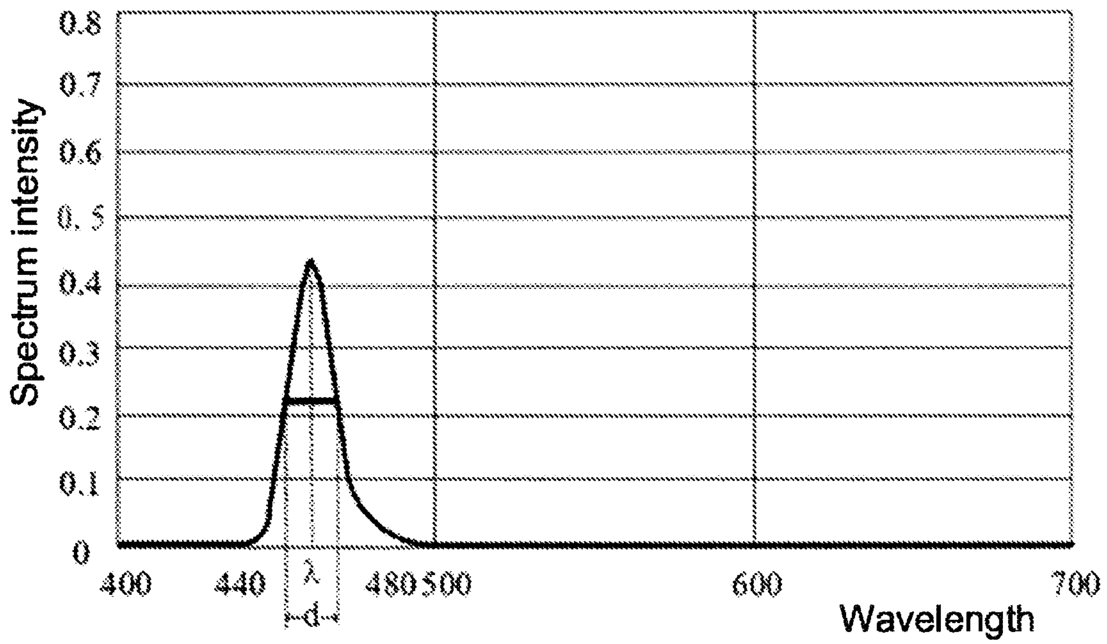
FIG. 10 is a diagram of an emission spectrum of a blue light-emitting device, in accordance with some embodiments.

FIG. 10 is a diagram of an emission spectrum of the blue light-emitting device, in accordance with some embodiments.

In some embodiments, as shown in FIG. 10, a wavelength λ corresponding to an emission spectrum peak of the blue light-emitting device 210 is in a range of 440 nm to 480 nm, such as 440 nm, 450 nm, 460 nm, 470 nm or 480 nm. By limiting the wavelength corresponding to the emission spectrum peak of the blue light-emitting device 210 to the range of 440 nm to 480 nm, it is possible to reduce the irritation and damage to human eyes caused by the blue light emitted by the blue light-emitting device 210.

In these embodiments, as shown in FIG. 10, full width at half maximum (FWHM) d of the emission spectrum of the blue light-emitting device 210 is less than or equal to 50 nm, such as 15 nm, 20 nm, 22 nm, 30 nm, 35 nm, 40 nm, 45 nm or 50 nm. The full width at half maximum d of the emission spectrum of the blue light-emitting device 210 represents that a width (i.e., a difference) of the corresponding wavelength when the emission spectrum of the blue light-emitting device 210 is half of its emission spectrum peak. The narrower the full width at half maximum of the emission spectrum of the blue light-emitting device 210 is, the higher the color purity of the blue light emitted by the blue light-emitting device 210 is. Therefore, by limiting the full width at half maximum of the emission spectrum of the blue light-emitting device 210 to a small range, it is possible to improve the color purity of the blue light emitted by the blue light-emitting device 210.

With reference to FIGS. 9A to 9C, the blue light-emitting device 210 may include a first electrode AE, at least one blue light-emitting layer 21 and a second electrode CE that are sequentially stacked in a direction away from the base substrate 100. For example, the light-emitting substrate 1000 is a top emission light-emitting substrate. The first electrode AE is a reflective electrode that can reflect light, such as an anode. The second electrode CE is a transmissive electrode that can transmit light, such as a cathode. In this way, a microcavity structure is formed between the anode and the cathode. The blue light-emitting device 210 may include one or more blue light-emitting layers 21. For example, the blue light-emitting device 210 is a stacked light-emitting device including two or three blue light-emitting layers 21.

In some examples, the first electrode AE may include a stacked composite structure including transparent conductive oxide/metal/transparent conductive oxide. The transparent conductive oxide material is, for example, indium tin oxide (ITO) or indium zinc oxide (IZO); and the metal material is, for example, gold (Au), silver (Ag), nickel (Ni) or platinum (Pt). For example, the anode has a structure of ITO/Ag/ITO. An average reflectivity of the first electrode AE for visible light may be in a range of 85% to 95%, inclusive. The second electrode CE may include Ag, magnesium (Mg), copper (Cu), aluminum (Al), Pt, palladium (Pd), Au, Ni, neodymium (Nd), iridium (Ir), chromium (Cr), lithium (Li), calcium (Ca), lithium fluoride (LiF)/Ca, LiF/Al, molybdenum (Mo) or titanium (Ti), or a compound or mixture thereof, such as a mixture of Ag and Mg.

Figure 11:
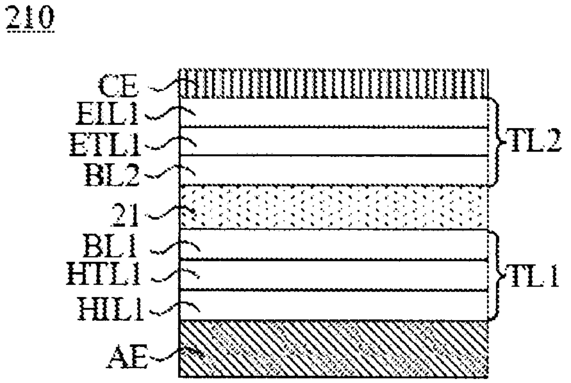
FIG. 11 is a structural diagram of a blue light-emitting device, in accordance with some embodiments.

FIG. 11 is a structural diagram of the blue light-emitting device, in accordance with some embodiments.

In some embodiments, as shown in FIG. 11, the blue light-emitting device 210 includes a first transport layer TL1, a blue light-emitting layer 21, and a second transport layer TL2. The first transport layer TL1 may be located between the blue light-emitting layer 21 and the first electrode AE, and the first transport layer TL1 is configured to transport holes from the first electrode AE to the blue light-emitting layer 21. The second transport layer TL2 may be located between the blue-emitting layer 21 and the second electrode CE, and the second transport layer TL2 is configured to transport electrons from the second electrode CE to the blue-emitting layer 21. In this way, the holes and electrons can recombine in the blue light-emitting layer 21 to enable the blue light-emitting layer 21 to emit light.

For example, as shown in FIG. 11, the first transport layer TL1 includes a first hole injection layer HIL1 and a first hole transport layer HTL1. The first hole injection layer HIL1 is located between the first electrode AE and the first hole transport layer HTL1, and the first hole injection layer HIL1 is configured to inject holes from the first electrode AE into the first hole transport layer HTL1. The first hole transport layer HTL1 is located between the first hole injection layer HIL1 and the blue light-emitting layer 21, and the first hole transport layer HTL1 is configured to transport holes injected by the first hole injection layer HIL1 to the blue light-emitting layer 21, so that the holes and electrons recombine in the blue light-emitting layer 21 to achieve the light emission of the blue light-emitting layer 21.

In some examples, as shown in FIG. 11, the first transport layer TL1 further includes a first exciton blocking layer BL1. The first exciton blocking layer BL1 is located between the first hole transport layer HTL1 and the blue light-emitting layer 21, and the first exciton blocking layer BL1 is configured to block the movement of electrons in the blue light-emitting layer 21 towards the first electrode AE. Therefore, the first exciton blocking layer BL1 may also be referred to as an electron blocking layer EBL.

In some examples, as shown in FIG. 11, the second transport layer TL2 includes a first electron transport layer ETL1 and a first electron injection layer EIL1. The first electron injection layer EIL1 is located between the first electron transport layer ETL1 and the second electrode CE, and the first electron injection layer EIL1 is configured to inject electrons provided by the second electrode CE into the first electron transport layer ETL1. The first electron transport layer ETL1 is located between the first electron injection layer EIL1 and the blue light-emitting layer 21, and the first electron transport layer ETL1 is configured to transport electrons injected by the first electron injection layer EIL1 to the blue light-emitting layer 21, so that the electrons and holes can recombine in the blue light-emitting layer 21 to achieve the light emission of the blue light-emitting layer 21.

In some examples, as shown in FIG. 11, the second transport layer TL2 further includes a second exciton blocking layer BL2. The second exciton blocking layer BL2 is located between the first electron transport layer ETL1 and the blue light-emitting layer 21, and the second exciton blocking layer BL2 is configured to block the movement of the holes in the blue light-emitting layer 21 towards the second electrode CE. Therefore, the second exciton blocking layer BL2 may be referred to as a hole blocking layer HBL.

In some embodiments, the blue light-emitting layer 21 includes a blue phosphorescent light-emitting material, and the blue light-emitting layer 21 further includes a host material and a guest material.

The first host material includes hole injection and transport materials and electron injection and transport materials, and has a good hole transport performance and electron transport performance. For example, the first host material includes at least 1 triazine group and at least 1 carbazole group. For example, the first host material includes 1 triazine group and 1 carbazole group. As another example, the first host material includes 1 triazine group and 2 carbazole groups.

In the blue light-emitting layer 21, a ratio between electron mobility of the first host material to hole mobility of the first host material is greater than or equal to 80, such as 80, 82, 86, 90, 92, 95, 98, 100, 110 or 120. The ratio between the electron mobility of the first host material and the hole mobility of the first host material is limited to a large range, i.e., the electron mobility of the first host material is limited to be much greater than the hole mobility of the first host material, the electron transport rate is greater than the hole transport rate in the blue emitting layer 21, so that the first host material has good triplet exciton confinement ability to block the excitons in the blue light-emitting layer 21 from transporting to the second electrode CE (i.e., the cathode). Thus, the excitons may be limited in the blue light-emitting layer 21, and the carrier balance may be ensured, thereby improving the luminous efficiency of the blue light-emitting layer 21.

The first guest material may be a blue phosphorescent material, and has good luminous performance.

In some examples, the first guest material may be a metal complex including any one of metal element iridium, platinum, palladium or cerium and at least two nitrogen heterocyclic carbene ligands. For example, the first guest material is a metal complex including metal element iridium and two nitrogen heterocyclic carbene ligands. As another example, the first guest material is a metal complex including metal element platinum and two nitrogen heterocyclic carbene ligands.

The metal complex selected as the first guest material has good compatibility between the iridium, platinum, palladium or cerium metal element and the nitrogen heterocyclic carbene ligand; the metal complex has high internal quantum efficiency, and the triplet energy level of the metal complex is higher than that of the existing blue phosphorescent material and blue fluorescent material, thereby improving the luminous efficiency of the blue light-emitting layer 21.

In some examples, in the blue light-emitting layer 21, the triplet energy level of the first host material is greater than the triplet energy level of the first guest material. A difference between the triplet energy level of the first host material and the triplet energy level of the first guest material is greater than or equal to 0.1 eV, such as 0.1 eV, 0.12 eV, 0.15 eV, 0.2 eV, 0.3 eV, 0.5 eV, 0.8 eV or 1 eV.

In this way, the triplet excitons with a higher triplet energy level in the first host material may confine and block the triplet excitons with a lower energy level in the blue emitting layer 21 from transporting to the second electrode CE (i.e., the cathode), thereby confining triplet excitons in the blue light-emitting layer 21 to improve the luminous efficiency of the blue light-emitting layer 21.

In some examples, in the blue light-emitting layer 21, the weight proportion of the first host material in the blue light-emitting layer 21 is greater than or equal to 70%, such as 70%, 75%, 80%, 85%, 90% or 95%. The weight proportion of the first guest material in the blue light-emitting layer 21 is less than or equal to 30%, such as 5%, 8%, 10%, 15%, 20%, 25% or 30%.

The light-emitting performance of the first guest material (i.e., the blue phosphorescent material) is better than that of the first host material. By respectively limiting the weight proportion of the first host material in the blue light-emitting layer 21 and the weight proportion of the first guest material in the blue light-emitting layer 21, a ratio of the weight of the first guest material to the weight of the first host material may be limited to an appropriate range, so that the luminous efficiency of the blue light-emitting layer 21 is high.

In this way, on the basis of improving the luminous efficiency of the blue light-emitting layer 21, the operating load (including the driving voltage and operating current) of the blue light-emitting device 210 may be reduced, thereby extending the service life of the blue light-emitting device 210, and also reducing the probability that the red light-emitting device and/or the green light-emitting device adjacent to the blue light-emitting device 210 is lit up. Thus, the color display effect of the light-emitting substrate 1000 and the display apparatus 3000 is improved.

In some other embodiments, the blue light-emitting layer 21 may include a blue super-fluorescent light-emitting material, and the blue light-emitting layer 21 may include a second host material, a sensitizer and a second guest material.

The second host material includes hole injection and transport materials and electron injection and transport materials, and has a good hole transport performance and electron transport performance. For example, the second host material includes at least 1 triazine group and at least 1 carbazole group. For example, the second host material includes 1 triazine group and 1 carbazole group. As another example, the second host material includes 1 triazine group and 2 carbazole groups.

In the blue light-emitting layer 21, a ratio of electron mobility of the second host material to hole mobility of the second host material is less than or equal to 0.2, such as 0.05, 0.1, 0.15 or 0.2.

Limiting the ratio between the electron mobility of the second host material and the hole mobility of the second host material within a small range can improve the electron transport performance and hole transport performance of the blue light-emitting layer 21, so that the electrons and holes in the blue light-emitting layer 21 can be evenly distributed to ensure the carrier balance. Thus, the utilization rate of electrons and holes in the blue light-emitting layer 21 is improved, thereby improving the luminous efficiency of the blue light-emitting layer 21.

The sensitizer may be a thermally activated delayed fluorescent material with luminescent property. For example, the sensitizer includes at least 1 carbazole group and at least 1 cyano group. For example, the sensitizer includes 2 carbazole groups and 1 cyano group. As another example, the sensitizer includes 4 carbazole groups and 1 cyano group.

Figure 12:
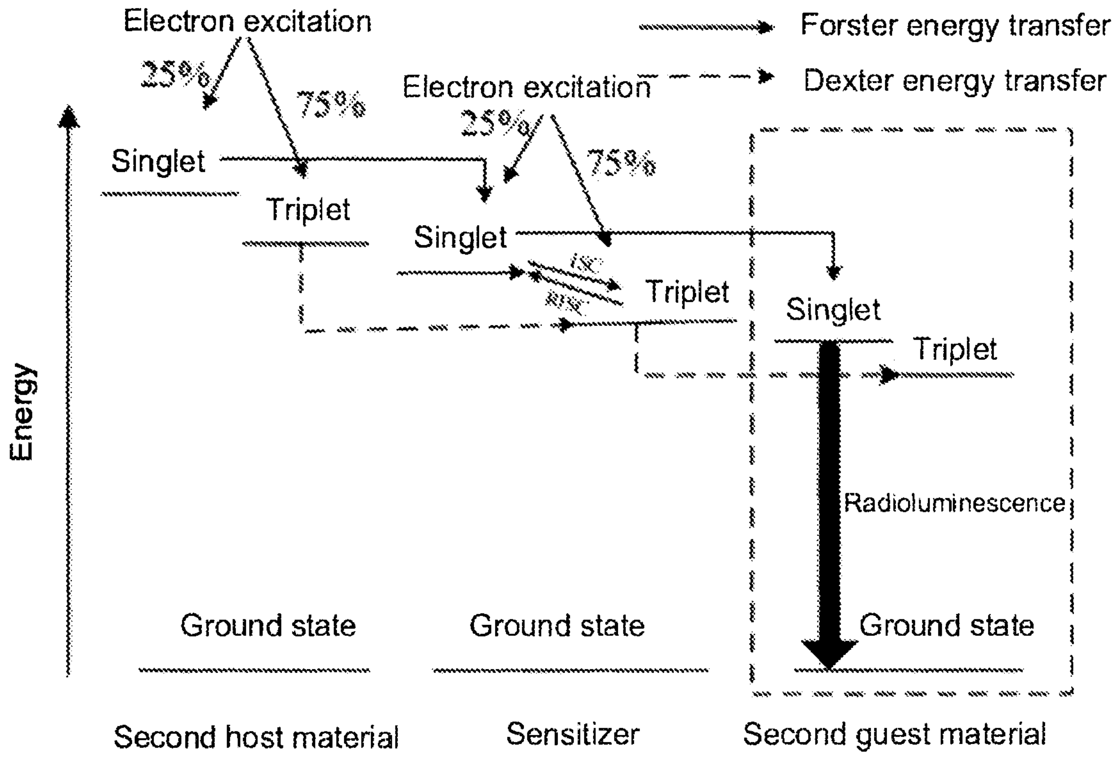
FIG. 12 is a schematic diagram of energy transfer of a super fluorescent light-emitting material in the blue light-emitting layer, in accordance with some embodiments.

FIG. 12 is a schematic diagram of energy transfer of the super fluorescent light-emitting material in the blue light-emitting layer, in accordance with some embodiments.

As shown in FIG. 12, due to the organic structure unit of the thermally activated delayed fluorescent material, the lowest occupied orbital (LUMO) and the highest unoccupied orbital (HOMO) can be effectively separated, so that the energy level difference between the singlet and triplet states of the lowest excited carrier is reduced. Triplet excitons may be converted into singlet excitons by thermal activation delayed fluorescent material molecules through the reverse intersystem crossing process, and then transition back to the ground state through radiation, thus emitting fluorescence, thereby improving the exciton utilization rate of the blue light-emitting layer.

In some examples, the ratio of the electron mobility of the sensitizer to the hole mobility of the sensitizer is greater than or equal to 8, such as 8, 10, 12, 15, or 20.

By limiting the ratio of the electron mobility of the sensitizer to the hole mobility of the sensitizer to a large range, i.e., by limiting the electron mobility of the sensitizer to be much greater than the hole mobility of the sensitizer, the electron transport rate of carriers is greater than the hole transport rate in the blue emitting layer 21, so that the sensitizer has good triplet exciton confinement ability to block the excitons in the blue light-emitting layer 21 from transporting to the second electrode CE (i.e., the cathode). Thus, the excitons may be limited in the blue light-emitting layer 21, and the carrier balance may be ensured, thereby improving the luminous efficiency of the blue light-emitting layer 21.

In some examples, an absolute value of the difference between the singlet energy level of the sensitizer and the triplet energy level of the sensitizer is less than or equal to 0.5 eV, such as 0.1 eV, 0.2 eV, 0.3 eV, 0.4 eV, or 0.5 eV.

By limiting the difference between the singlet energy level of the sensitizer and the triplet energy level of the sensitizer to a small range, i.e., by making the singlet energy level of the sensitizer be close to the triplet energy level of the sensitizer, it is possible to reduce the difficulty for the triplet excitons of the sensitizer to be converted into singlet excitons through the reverse intersystem crossing process. Thus, the luminous efficiency of the blue emitting layer 21 is reduced.

In some examples, a proportion of a weight of the sensitizer to a sum of a weight of the second host material and the weight of the sensitizer is less than or equal to 30%, such as 5%, 10%, 15%, 20%, 25% or 30%.

A proportion of the sum of the weight of the sensitizer and the weight of the second host material to a weight of the blue light-emitting layer 21 is high (nearly 100%). Therefore, limiting the weight proportion of the sensitizer in the blue light-emitting layer 21 is equivalent to limiting the weight proportion of the second host material in the blue light-emitting layer 21, it is possible to ensure that the blue light-emitting layer 21 has high electron transport performance and high hole transport performance, so as to ensure that the blue light-emitting layer 21 has a high luminous efficiency; moreover, limiting the weight proportion of the sensitizer in the blue light-emitting layer 21 may prevent energy quenching from occurring during recombination of the electrons and holes due to the action of the sensitizer with an excessively high weight proportion (i.e., the sensitizer with an excessive concentration).

In this embodiment, the second guest material may be a multi-resonance fluorescent material. The second guest material may include at least one boron atom and at least two nitrogen atoms. For example, the second guest material may include three boron atoms and three nitrogen atoms.

Figure 13:
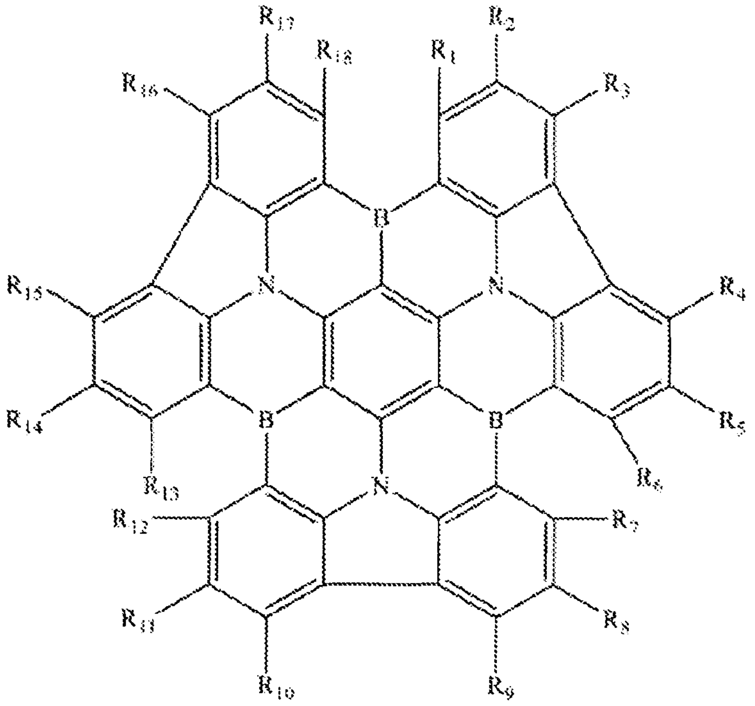
FIG. 13 is a structural diagram of a general formula of a second guest material, in accordance with some embodiments.

FIG. 13 is a structural diagram of a general formula of the second guest material, in accordance with some embodiments.

In some examples, the second guest material is selected from any one of the structures represented by the general formula shown in FIG. 13. The substituent groups $R_1$ to $R_{18}$ are the same or different, and are independently selected from any one of hydrogen, alkyl, aryl or heteroaryl; adjacent substituent groups $R_1$ to $R_{18}$ form a fused ring or form no fused ring. For example, in the general structure of the second guest material as shown in FIG. 13, the substituent groups $R_1$ to $R_{18}$ may be independently selected from any of hydrogen, C1 to C12 alkyl groups, C6 to C30 aryl groups, or C3 to C30 heteroaromatic groups.

The second guest material is a multi-resonance material with the general structural formula shown in FIG. 13, which can form a multi-resonance thermally activated delayed fluorescent material with the sensitizer. Since the multi-resonant thermally activated delayed fluorescent material has multi-resonance effects within molecules, the highest occupied orbital (HOMO) and lowest unoccupied orbital (LUMO) energy levels can be effectively separated onto different atoms, thereby improving the radiation rate and minimizing the energy level difference between the singlet and triplet states of excitons in the blue light-emitting layer 21. Thus, it is possible to improve the exciton utilization rate, thereby improving the luminous efficiency of the blue light-emitting layer 21.

In some examples, a ratio of a weight of the second guest material to a sum of the weight of the second host material and the weight of the sensitizer is less than or equal to 5%, such as 0.5%, 1%, 1.5%, 2%, 2.5%, 3%, 3.5%, 4%, 4.5% or 5%.

The second guest material is a multi-resonance fluorescent material, and the higher the weight proportion (i.e., concentration) of the multi-resonance fluorescent material in the blue light-emitting layer 21, the stronger the quenching and sensitivity to energy. Therefore, by limiting the weight proportion of the second guest material in the blue light-emitting layer 21, the energy quenching property of the multi-resonance fluorescent material is reduced, thereby improving the luminous efficiency of the blue light-emitting layer 21.

Figure 14:
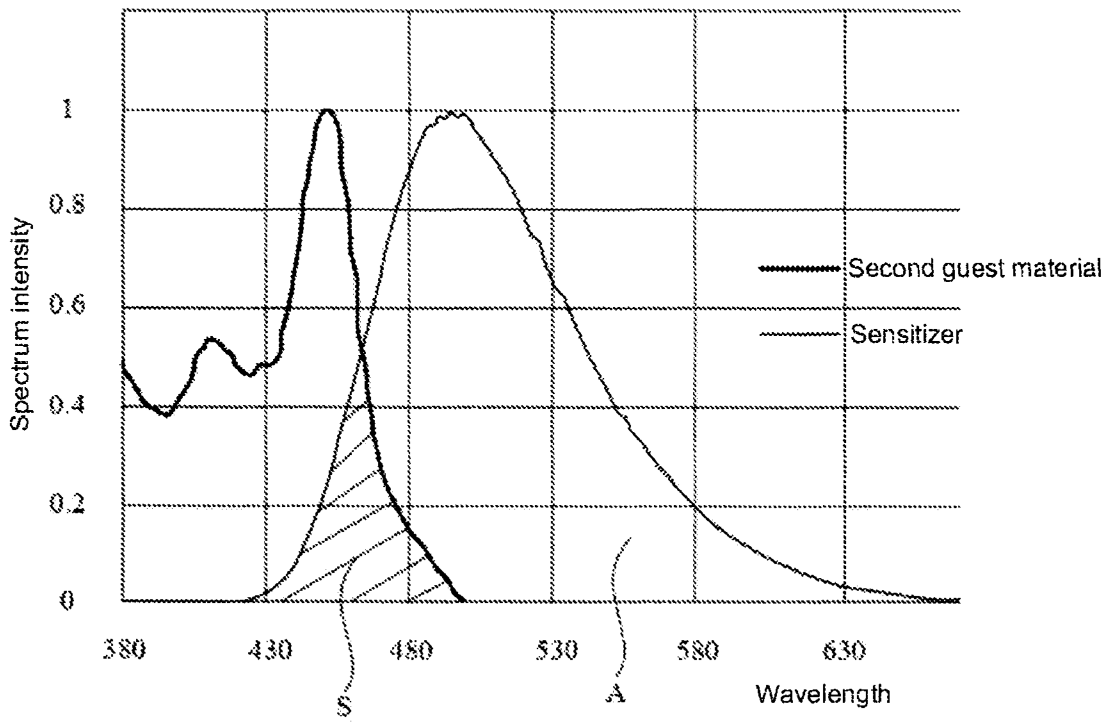
FIG. 14 is a diagram of an absorption spectrum of a second guest material and an emission spectrum of a sensitizer, in accordance with some embodiments.

FIG. 14 is a diagram of an absorption spectrum of the second guest material and an emission spectrum of the sensitizer, in accordance with some embodiments.

In some examples, as shown in FIG. 14, a proportion of an overlapping area S between the absorption spectrum of the second guest material and the emission spectrum of the sensitizer to an area A of emission spectrum of the sensitizer is greater than or equal to 8%, such as 8%, 10%, 15%, 20%, 30% or 50%.

The greater the proportion of the overlapping area S between the absorption spectrum of the second guest material and the emission spectrum of the sensitizer to the area A of the emission spectrum of the sensitizer, the more conducive it is to transfer the exciton energy on the sensitizer to the second guest. Thus, it is possible to improve the luminous efficiency of the second guest material, thereby improving the luminous efficiency of the blue light-emitting layer 21. As a result, the luminous efficiency of the blue light-emitting device 210 is improved, and the operating load of the blue light-emitting device 210 may be reduced, and the service life of the blue light-emitting device 210 is extended on the basis of improving the luminous efficiency of the blue light-emitting layer 21.

In some examples, as shown in FIG. 14, the proportion of the overlapping area S between the absorption spectrum of the second guest material and the emission spectrum of the sensitizer to the area A of emission spectrum of the sensitizer is less than or equal to 80%, such as 10%, 15%, 20%, 30%, 50%, 60%, 70% or 80%.

By limiting the proportion of the overlapping area S between the absorption spectrum of the second guest material and the emission spectrum of the sensitizer to the area A of the emission spectrum of the sensitizer to an appropriate range, the exciton energy transfer efficiency between the sensitizer and the second guest material may be greatly improved, thereby improving the luminous efficiency of the blue light-emitting layer 21 to improve the luminous efficiency of the blue light-emitting device 210.

In this embodiment, the singlet energy level of the second host material is greater than the singlet energy level of the sensitizer and greater than the triplet energy level of the sensitizer, and the triplet energy level of the second host material is also greater than the singlet energy level of the sensitizer and greater than the triplet energy level of the sensitizer; the singlet energy level of the sensitizer is greater than the singlet energy level of the second guest material and greater than the triplet energy level of the second guest material, and the triplet energy level of the sensitizer is also greater than the is also greater than the second guest material and greater than the triplet energy level of the second guest material. In this way, it is conducive to transfer the exciton energy on the second host material to the sensitizer, and then transfer the exciton energy on the sensitizer to the second guest material, which may reduce the loss during the exciton energy transfer process, thereby improving the luminous efficiency of the blue light-emitting layer 21.

In this way, on the basis of improving the luminous efficiency of the blue light-emitting layer 210, the operating load (including the driving voltage and/or operating current) of the blue light-emitting device 210 may be reduced, thereby extending the service life of the blue light-emitting device 210, and also reducing the probability that the red light-emitting device and/or the green light-emitting device adjacent to the blue light-emitting device 210 is lit up. As a result, the color display effect of the light-emitting substrate 1000 and the display apparatus 3000 is improved.

As shown in FIG. 3 and FIGS. 9A to 9C, the light-emitting unit 200 further includes a first light enhancement layer 220 located on the side of the blue light-emitting device 210 away from the base substrate 100. For example, the first light enhancement layer 220 is located on the surface of the second electrode CE away from the blue-emitting layer 21, which can be understood that the first light enhancement layer 220 may directly contact with the surface of the second electrode CE away from the blue light-emitting layer 21.

The light emitted from the blue light-emitting layer 21 may be transmitted through the second electrode CE and then enter the first light enhancement layer 220, and the first light enhancement layer 220 is configured to increase the amount of displayable light emitted from the blue light-emitting layer 21.

The first light enhancement layer 220 may also be referred as a light extraction layer or a light coupling layer. For example, the first light enhancement layer 220 is of a whole layer structure in the same pixel unit region PU. In the same pixel unit region PU, the thicknesses of the first light enhancement layer 220 respectively corresponding to the first sub-pixel region P1, the second sub-pixel region P2 and the third sub-pixel region P3 may be the same or different. For another example, the first light enhancement layer 220 is of a patterned structure in different pixel unit regions PU. In different pixel unit regions PU, the thickness of the first light enhancement layer 220 may be the same or different.

For example, refractive index of the first light enhancement layer 220 is greater than or equal to 1.8, such as 1.8, 1.9, or 2.0.

Since the refractive index of the first light enhancement layer 220 is relatively large, the light emitted from the blue light-emitting layer 21 is refracted when transmitted through the first light enhancement layer 220, and the refraction angle of the light is smaller than the incident angle of the light, so that the propagation direction of the light emitted from the blue light-emitting layer 21 deflects toward a direction perpendicular to the base substrate 100. Thus, it is possible to improve the amount of light emitted from the blue light-emitting layer 21, thereby improving the luminous efficiency and display effect of the light-emitting substrate 1000 and the display apparatus 3000.

In some embodiments, as shown in FIGS. 9A to 9C, the light-emitting unit 200 further includes a second light enhancement layer 230. The second light enhancement layer 230 is located on a side of the first light enhancement layer 220 away from the base substrate 100. The second light enhancement layer 230 includes a first inorganic layer 24, an organic layer 25 and a second inorganic layer 26 that are sequentially stacked in a direction in which the first light enhancement layer is away from the base substrate. Refractive index of the first inorganic layer 24 and refractive index of the second inorganic layer 26 are large, and refractive index of the organic layer 25 is smaller than the refractive index of the first inorganic layer 24 and smaller than the refractive index of the second inorganic layer 26.

The light emitted from the blue light-emitting layer 21 is sequentially constrained by the first inorganic layer 24 with a larger refractive index, the organic layer 25 with a smaller refractive index, and the second inorganic layer 26 with a larger refractive index, which may reduce the influence of blue light on the color shift phenomenon in a large viewing angle, thereby improving the display effect of the light-emitting substrate 1000 and the display apparatus 3000.

In some examples, the second light enhancement layer 230 may have the property of isolating moisture and oxygen, and the second light enhancement layer 230 is configured to encapsulate the light-emitting devices in the light-emitting unit 200 and the first light enhancement layer 220. Therefore, the second light enhancement layer may also be referred to as an encapsulation layer.

For example, the materials of the first inorganic layer 24 and the second inorganic layer 26 may be selected from at least one of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride or lithium fluoride. The material of the organic layer 25 is at least one of acrylic resin, methacrylic resin, polyisoprene, vinyl resin, epoxy resin, polyurethane resin, cellulose resin or perylene resin. The number of layers, material and structure of the film encapsulation layer may be varied by those skilled in the art according to requirements, which is not limited in the present disclosure.

In some embodiments, as shown in FIGS. 9A and 9B, the second light enhancement layer 230 further includes a third inorganic layer 27. The third inorganic layer 27 may be disposed between the first light enhancement layer 220 and the first inorganic layer 24. Refractive index of the third inorganic layer 27 is less than the refractive index of the first light enhancement layer 220 and less than the refractive index of the first inorganic layer 24.

For example, the refractive index of the first light enhancement layer 220 is greater than or equal to 1.8 (e.g., 1.8, 1.9, or 2.0), and the refractive index of the third inorganic layer 27 is less than or equal to 1.5 (e.g., 1.3, 1.4, or 1.5), and the refractive index of the first inorganic layer 24 is also greater than or equal to 1.8 (e.g., 1.8, 1.9 or 2.0).

The light emitted from the blue light-emitting layer 21 is sequentially constrained by the light enhancement layer 220 with a larger refractive index, the third inorganic layer 27 with a smaller refractive index, and the first inorganic layer 24 with a larger refractive index, which may reduce the influence of blue light on the color shift phenomenon in a large viewing angle, thereby improving the display effect of the light-emitting substrate 1000 and the display apparatus 3000. Furthermore, the first inorganic layer 24, the organic layer 25 and the second inorganic layer 26 that are stacked in sequence can also be configured to encapsulate the light-emitting devices and the first light enhancement layer 220 in the light-emitting unit 200.

In some embodiments, as shown in FIG. 3 and FIGS. 9A to 90, the light extraction member 300 is located on a side of the second light enhancement layer 230 away from the base substrate 100. An orthographic projection of the light extraction member 300 on the base substrate 100 at least partially overlaps with an orthographic projection of the blue light-emitting device 210 on the base substrate 100. It can be understood that, the orthographic projection of the light extraction member 300 on the base substrate 100 partially overlaps with an orthographic projection of a light-emitting portion of the blue light-emitting device 210 on the base substrate 100; alternatively, the orthographic projection of the light extraction member 300 on the base substrate 100 covers the orthographic projection of the light-emitting portion of the blue light-emitting device 210 on the base substrate 100. The light-emitting portion of the blue light-emitting device 210 is an effective light-emitting region of the blue light-emitting layer 21 defined by the first electrode AE (anode) and the first light-emitting opening K1 that is correspondingly covered by the blue light-emitting device 210.

At least part of the light emitted from the blue light-emitting device 210 may enter the light extraction member 300. In this case, since the light extraction member 300 has a large refractive index, the propagation direction of the at least part of the light emitted from the blue light-emitting layer 21 deflects toward the direction perpendicular to the base substrate 100, which may increase the light extraction amount of the blue light-emitting device 210, thereby improving the luminous efficiency and display effect of the light-emitting substrate 1000 and the display apparatus 3000.

In some examples, the orthographic projection of the light extraction member 300 on the base substrate 100 partially overlaps with the orthographic projection of the light-emitting portion of the blue light-emitting device 210 on the base substrate 100. For example, as shown in FIG. 9A, the blue light-emitting device 210 covers the first light-emitting opening K1, the green light-emitting device covers the second light-emitting opening K2, and the red light-emitting device covers the third light-emitting opening K3. The light extraction member 300 may be of a patterned structure, and the orthographic projection of the light extraction member 300 on the base substrate 100 may only cover part of the orthographic projection of the light-emitting portion of the blue light-emitting device 210 on the base substrate 100, and the light extraction member 300 exposes the green light-emitting device and the red light-emitting device.

In the light-emitting substrate 1000, other parts that are in the same layer as the light extraction member 300 with a patterned structure may be made into a flat surface by a manner of filling an optical clear adhesive, which facilitates the manufacturing of components in subsequent processes.

Part of the light emitted from the blue light-emitting device 210 may enter the light extraction member 300, so that the propagation direction of the part of the light emitted from the blue light-emitting device 210 deflects toward the direction perpendicular to the base substrate 100, thereby improving the light extraction efficiency of the partial region of the blue light emitting device 210 corresponding to the light extraction member 300. Moreover, the light extraction member 300 exposes the green light-emitting device and the red light-emitting device, so that it does not block the light emitted by the green light-emitting device and the red light-emitting device, thereby ensuring the luminous efficiency of the green light-emitting device and the red light-emitting device.

In some other examples, the orthographic projection of the light extraction member 300 on the base substrate 100 covers the orthographic projection of the light-emitting portion of the blue light-emitting device 210 on the base substrate 100. For example, the orthographic projection of the light extraction member 300 on the base substrate 100 covers the orthographic projection of the light-emitting portion of the blue light-emitting device 210 on the base substrate 100, and is larger than the orthographic projection of the light-emitting portion of the blue light-emitting device 210 on the base substrate 100. For example, as shown in FIG. 9C, the light extraction member 300 may be of a whole-layer structure. The orthographic projection of the light extraction member 300 on the base substrate 100 covers an orthographic projection of the light-emitting unit 200 on the base substrate 100, which can be understood that, the orthographic projection of the light extraction member 300 on the base substrate 100 covers the orthographic projection of the blue light-emitting device 210 on the base substrate 100, the orthographic projection of the green light-emitting device on the base substrate 100 and the orthographic projection of the red light-emitting device on the base substrate 100.

For example, as shown in FIG. 9B, the light extraction member 300 may be of a patterned structure. The orthographic projection of the light extraction member 300 on the base substrate 100 completely overlaps with the orthographic projection of the light-emitting portion of the blue light-emitting device 210 on the base substrate 100, and the light extraction member 300 exposes the green light-emitting device and the red light-emitting device.

Almost all the light emitted from the blue light-emitting device 210 may enter the light extraction member 300, so that the propagation direction of the light emitted from the blue light-emitting device 210 deflects toward the direction perpendicular to the base substrate 100. Thus, the amount of light emitted by the blue light-emitting device 210 is improved, thereby improving the luminous efficiency of the entire blue light-emitting device 210. Moreover, the light extraction member 300 exposes the green light-emitting device and the red light-emitting device, so that it does not block the light emitted by the green light-emitting device and the red light-emitting device. As a result, it is possible to ensure the luminous efficiency of the green light-emitting device and the red light-emitting device, thereby improving the luminous efficiency of the light-emitting substrate 1000 and the display apparatus 3000.

Figure 15:
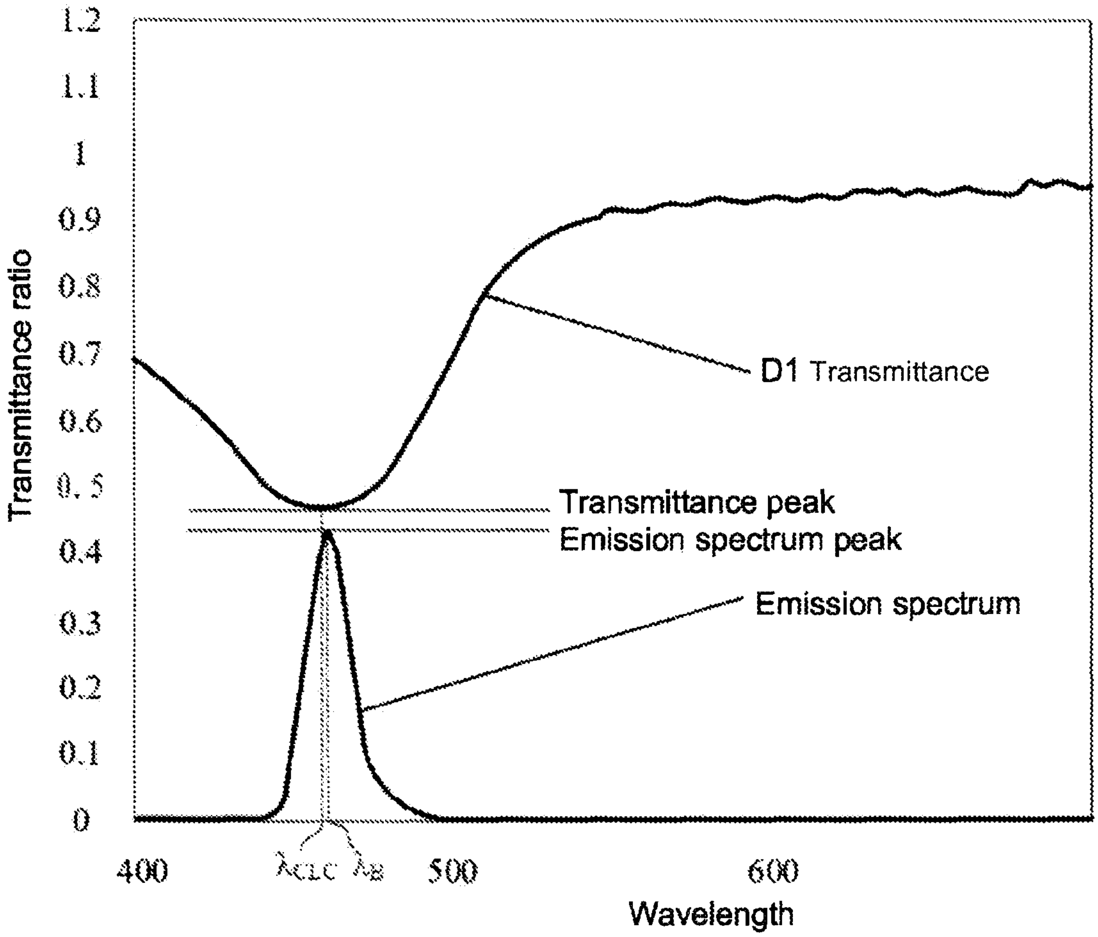
FIG. 15 is a comparison diagram between a transmittance curve of a light extraction member and an emission spectrum of a blue light-emitting device, in accordance with some embodiments (Embodiment 1)

FIG. 15 is a comparison diagram between a transmittance curve of the light extraction member and the emission spectrum of the blue light-emitting device, in accordance with some embodiments.

In some embodiments, as shown in FIG. 15, an absolute value of a difference between a wavelength $\lambda_{cLc}$ corresponding to a transmittance peak of the light extraction member 300 and a wavelength $\lambda_B$ corresponding to an emission spectrum peak of the blue light-emitting device 210 is less than or equal to 10 nm, such as 10 nm, 9 nm, 8 nm, 6 nm, 5 nm, 4 nm or 3 nm. Limiting the difference range between the wavelength corresponding to the transmittance peak of the light extraction member 300 and the wavelength corresponding to the emission spectrum peak of the blue light-emitting device 210 may be understood as making the transmittance peak of the light extraction member 300 closer to the emission spectral peak of the blue light-emitting device 210, which may increase the amount of the blue light emitted from the blue light-emitting device 210 transmitting the light extraction member 300, thereby improving the light extraction efficiency of the blue light-emitting device 210.

In this way, on the basis of improving the light extraction efficiency of the blue light-emitting layer 210, the operating load (including the driving voltage and/or operating current) of the blue light-emitting device 210 may be reduced, thereby extending the service life of the blue light-emitting device 210, and also reducing the probability that the red light-emitting device and/or the green light-emitting device adjacent to the blue light-emitting device 210 is lit up. Thus, the color display effect of the light-emitting substrate 1000 is improved.

In some examples, as shown in FIG. 15, the absolute value of the difference between the wavelength $\lambda_{CLC}$ corresponding to the transmittance peak of the light extraction member 300 and the wavelength $\lambda_B$ corresponding to the emission spectrum peak of the blue light-emitting device 210 is less than or equal to 3 nm, such as 3 nm, 2.5 nm, 2 nm, 1.5 nm, 1 nm or 0.5 nm. By limiting the difference between the wavelength corresponding to the transmittance peak of the light extraction member 300 and the wavelength corresponding to the emission spectrum peak of the blue light-emitting device 210 to a small range, it is possible to make the amount of blue light emitted from the blue light-emitting device 210 transmitting the light extraction element 300 as much as possible, thereby greatly improving the light extraction efficiency of the blue light-emitting device 210.

In some embodiments, the light extraction member 300 is a cholesteric liquid crystal (CLC) film layer. The cholesteric liquid crystal film layer has properties such as optical rotation, selectivity, light scattering, and circular polarization dichroism. Therefore, the light emitted from the blue light-emitting device 210 enters the cholesteric liquid crystal film layer, and the cholesteric liquid crystal film layer may cause part of the light emitted by the blue light-emitting device 210 is reflected, and the other part of the light is transmitted. The light reflected by the cholesteric liquid crystal film layer may be reflected again by the blue light-emitting device 210, and then the propagation direction changes. The propagation direction of this part of the reflected light will deflect toward the direction perpendicular to the base substrate 100, and finally, this part of the reflected light will transmit the cholesteric liquid crystal film layer. Therefore, it is possible to increase the amount of the light emitting from the blue light-emitting device 210, thereby improving the light extraction efficiency of the blue light-emitting device 210 in the light-emitting substrate 1000.

In some embodiments, as shown in FIG. 3 and FIGS. 9A to 9C, the light-emitting substrate 1000 further includes an anti-reflection layer 400. The anti-reflection layer 400 is disposed on a side of the light extraction member 300 away from the base substrate 100. In some examples, the anti-reflection layer 400 may be a polarizer or a filter film. The light emitted from the blue light-emitting layer 21 transmits the light extraction member 300 first, and then enters the anti-reflection layer 400. The anti-reflection layer 400 may make the light polarized to reduce or even inhibit the reflection of the light and to enhance the transmission of the light, so that the light further deflects towards the direction perpendicular to the base substrate 100, and thus the display effect of the light-emitting substrate 1000 may be improved.

Figure 16:
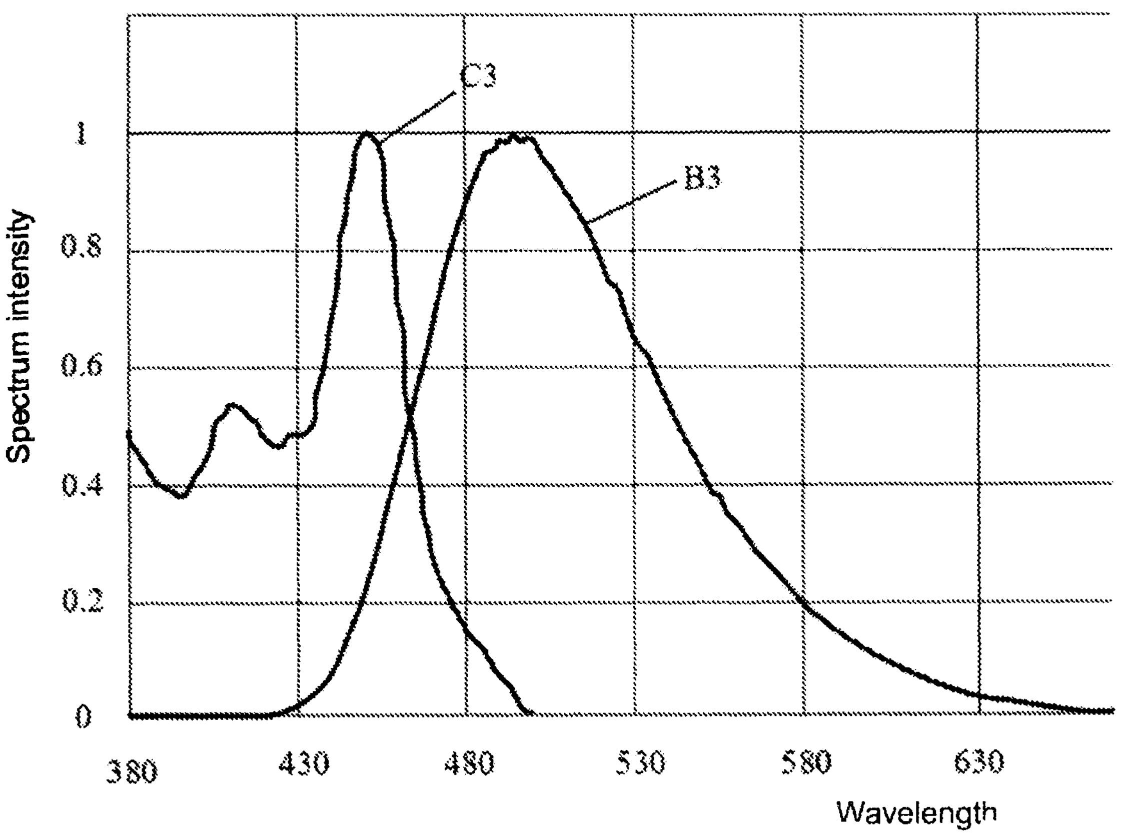
FIG. 16 is a diagram of an absorption spectrum of a second guest material C3 and an emission spectrum of a sensitizer B3 in Embodiment 2.
Figure 17:
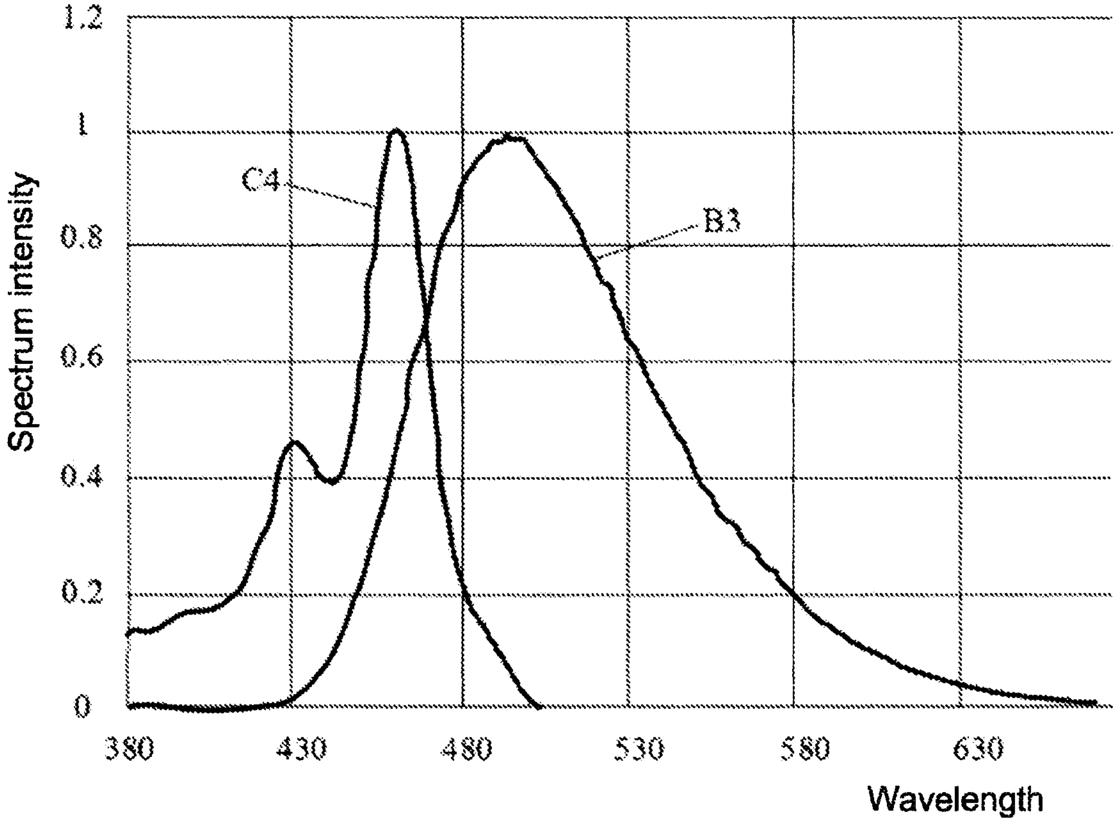
FIG. 17 is a diagram of an absorption spectrum of a second guest material C4 and an emission spectrum of a sensitizer B3 in Embodiment 3.
Figure 18:
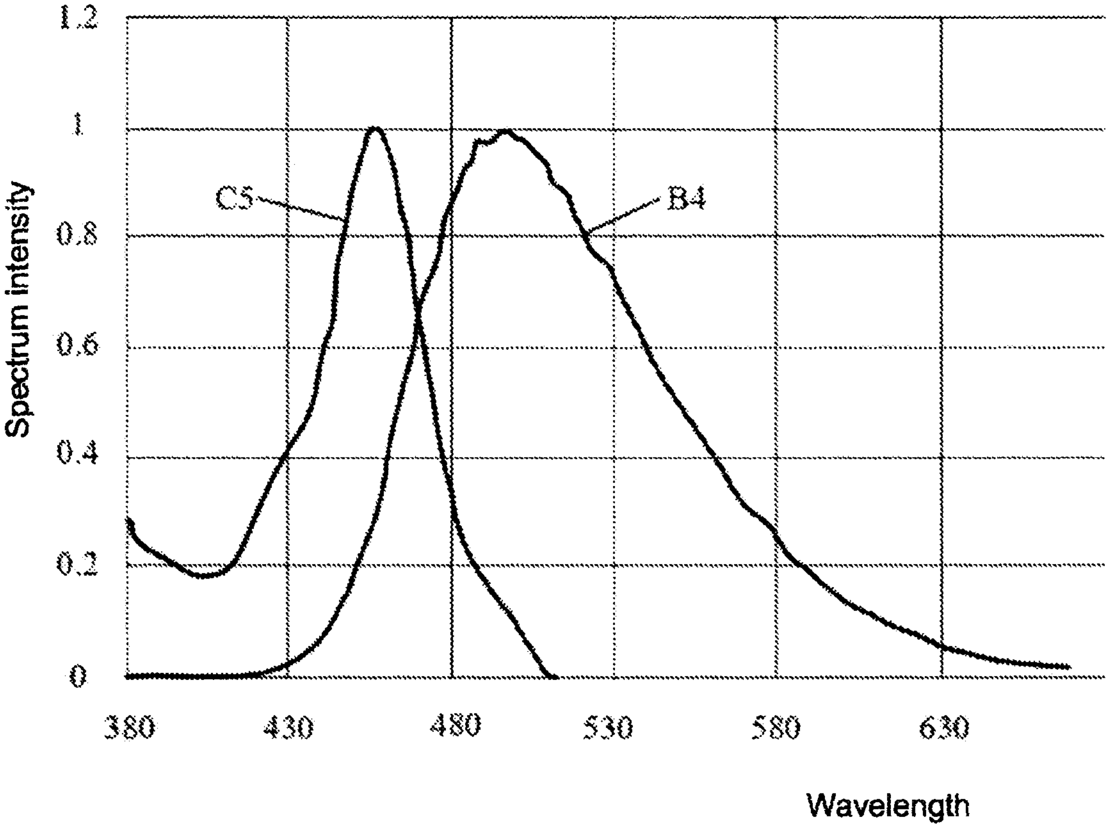
FIG. 18 is a diagram of an absorption spectrum of a second guest material C5 and an emission spectrum of a sensitizer B4 in Embodiment 4.
Figure 19:
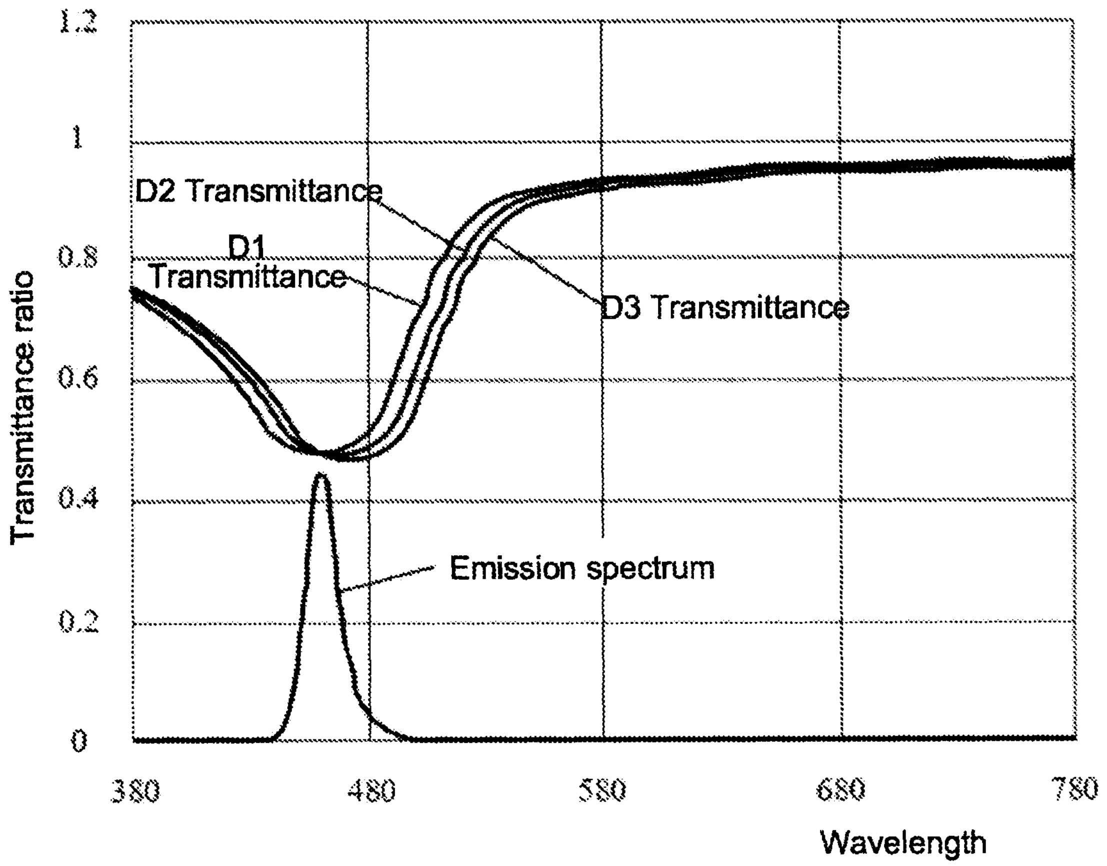
FIG. 19 is a comparison diagram between a transmittance curve of a light extraction member and an emission spectrum of a blue light-emitting device in Embodiment 2, Embodiment 5 and Comparative example 3.

Referring to FIGS. 15 to 19, the embodiments of the present disclosure provide five Embodiments and two Comparative examples for comparison. FIGS. 15 and 19 are respectively comparison diagrams between the transmittance curve of the light extraction member 300 and the emission spectrum of the blue light-emitting device 210 in five Embodiments and two Comparative examples provided by the embodiments of the present disclosure. FIGS. 16 to 18 are respectively diagrams of the absorption spectrum of the second guest material and the emission spectrum of the sensitizer in Embodiments 2 to 4 provided by the embodiments of the present disclosure.

Comparative example 1: the blue light-emitting layer 21 includes a first host material A1 and a first guest material C1, and the first guest material C1 is a fluorescent material. The light extraction member 300 is not provided.

Embodiment 1: the blue light-emitting layer 21 includes a first host material A2 and a first guest material C2. The light extraction member 300 adopts a CLC film layer D1.

In Embodiment 1, the triplet energy level of the first host material A2 is 0.15 eV higher than the triplet energy level of the first guest material C2. The first guest material C2 is a platinum-based metal complex. As shown in FIG. 15, a wavelength $\lambda_B$ corresponding to an emission spectrum peak of the blue light-emitting device 210 is 460 nm, a wavelength $\lambda_{CLC}$ corresponding to a transmittance peak of the CLC film layer is 461 nm, and an absolute value of a difference between the two is 1 nm. The material energy levels of the first host material A2 and the first guest material C2 are detailed in Table 1.

TABLE 1

| | S1 (eV) | T1 (eV) | T1 difference (eV) |
|---|---|---|---|
| First host material A2 | 3.35 | 2.89 | 0.15 |
| First guest material C2 | 3.08 | 2.74 | |

In Table 1, "S1 (eV)" represents the singlet energy level of the first host material A2 and the singlet energy level of the first guest material C2; "T1 (eV)" represents the triplet energy level of the first host material A2 and the triplet energy level of the first guest material C2; "T1 difference (eV)" represents a difference between the triplet energy level of the first host material A2 and the triplet energy level of the first guest material C2.

Embodiment 2: the blue light-emitting layer 21 includes a second host material A3, a sensitizer B3 and a second guest material C3. The light extraction member 300 adopts a CLC film layer D1. For the sensitizer B3, a difference between the singlet energy level and the triplet energy level is 0.22 eV. As shown in FIG. 16, an overlapping area between an absorption spectrum of the second guest material C3 and an emission spectrum of the sensitizer B3 accounts for 14.6% of an area of the emission spectrum of the sensitizer B3. A wavelength corresponding to the emission spectrum peak of the blue light-emitting device 210 is 460 nm, a wavelength corresponding to the transmittance peak of the CLC film layer is 461 nm, and the absolute value of the difference between the two is 1 nm. The material energy levels of the sensitizer B3 and the second guest material C3 are detailed in Table 2.

TABLE 2

| | S1 (eV) | T1 (eV) | $\Delta E_{ST}$ (eV) |
|---|---|---|---|
| Sensitizer B3 | 3.07 | 2.85 | 0.22 |
| Second guest material C3 | 2.95 | 2.83 | 0.12 |

In Table 2, "S1 (eV)" represents the singlet energy level of the sensitizer B3 and the singlet energy level of the second guest material C3; "T1 (eV)" represents the triplet energy level of the sensitizer B3 and the triplet energy level of the second guest material C3; "ΔEST (eV)" represents the difference between the singlet energy level of the sensitizer B3 and the triplet energy level of the sensitizer B3, and the difference between the singlet energy level of the second guest material C3 and the triplet energy level of the second guest material C3.

Comparative example 2: the structure and material of the blue light-emitting layer 21 are respectively the same as those of the blue light-emitting layer 21 in Embodiment 2, but the light extraction member 300 is not provided.

Referring to the parameters in Embodiment 1, Comparative example 1, Embodiment 2 and Comparative example 2, the performance of the light-emitting substrates 1000 respectively corresponding to Embodiment 1, Comparative example 1, Embodiment 2 and Comparative example 2 is tested at the same operating condition of luminance (e.g., 1000 nit), and the test result data are detailed in Table 3.

TABLE 3

| | Vol. | CE | Cross-talk |
|---|---|---|---|
| Comparative example 1 | 100% | 100% | existence |
| Embodiment 1 | 86% | 252% | inexistence |
| Embodiment 2 | 85% | 230% | inexistence |
| Comparative example 2 | 92% | 192% | existence |

In Table 3, "Vol." represents the driving voltage of the blue light-emitting device 210; "CE" represents the current luminous efficiency of the blue light-emitting device 210; "Cross-talk" represents a situation of a deterioration of the display effect of the light-emitting substrate 1000 caused by a fact that in a case where only the blue light-emitting device 210 in the light-emitting substrate 1000 is lit up, light-emitting devices of other colors adjacent to the blue light-emitting device 210 are simultaneously lit up by leakage current.

In Comparative example 1, a blue fluorescent luminescent material is used; in Embodiment 1, a blue phosphorescent luminescent material is used; in Embodiment 2 and Comparative example 2, a multi-resonant thermally activated delayed fluorescent material is used. In Comparative example 1 and Comparative example 2, the light extraction member 300 is not provided. In Embodiment 1 and Embodiment 2, the light extraction member 300 adopts a CLC film layer.

Referring to the parameters in Embodiment 1, Comparative example 1, Embodiment 2 and Comparative example 2, and based on the data in Table 3, it can be seen that, under the same operating condition of luminance, compared with the blue light-emitting device 210 in Comparative example 1, for Embodiments 1 and 2, the driving voltage of the blue light-emitting device 210 is reduced by about 15%, the current luminous efficiency is improved more than doubled, and there is no Cross-talk, which effectively improves the display effect of the light-emitting substrate 1000. It can be understood that, the light extraction member 300 may increase the amount of the light emitting from the blue light-emitting device 210, thereby improving the light extraction efficiency of the blue light-emitting device 210 in the light-emitting substrate 1000. Furthermore, in the blue fluorescent luminescent material including the first host material A2 and the first guest material C2 provided by the embodiments of the present disclosure, by limiting the ratio of the electron mobility of the first host material to the hole mobility of the first host material to a large range, i.e., by limiting the electron mobility of the first host material to be much greater than the hole mobility of the first host material, the electron transport rate of carriers is greater than the hole transport rate in the blue-emitting layer 21, so that the first host material has a good triplet exciton confinement ability to block the excitons in the blue light-emitting layer 21 from transporting to the second electrode CE (i.e., the cathode). Thus, the excitons may be limited in the blue light-emitting layer 21, and the carrier balance may be ensured, thereby improving the luminous efficiency of the blue light-emitting layer 21. In this way, on the basis of improving the luminous efficiency of the blue light-emitting layer 21, the operating load (including the driving voltage and operating current) of the blue light-emitting device 210 may be reduced, thereby extending the service life of the blue light-emitting device 210, and also reducing the probability that the red light-emitting device and/or the green light-emitting device adjacent to the blue light-emitting device 210 is lit up. Thus, the color display effect of the light-emitting substrate 1000 is improved.

Embodiment 3: the blue light-emitting layer 21 includes the second host material A3, the sensitizer B3 and the second guest material C4. The light extraction member 300 adopts a CLC film layer D1. The difference between the singlet energy level of sensitizer B3 and the triplet energy level of sensitizer B3 is 0.22 eV. As shown in FIG. 17, an overlapping area between an absorption spectrum of the second guest material C4 and an emission spectrum of the sensitizer B3 accounts for 19.3% of an area of the emission spectrum of the sensitizer B3. A wavelength corresponding to the emission spectrum peak of the blue light-emitting device 210 is 460 nm, a wavelength corresponding to the transmittance peak of the CLC film layer is 461 nm, and the absolute value of the difference between the two is 1 nm.

Embodiment 4: the blue light-emitting layer 21 includes the second host material A3, the sensitizer B4 and the second guest material C5. The light extraction member 300 adopts a CLC film layer D1. The difference between the singlet energy level of the sensitizer B4 and the triplet energy level of the sensitizer B4 is 0.12 eV. As shown in FIG. 18, the overlapping area between the absorption spectrum of the second guest material C5 and the emission spectrum of the sensitizer B4 accounts for 20.0% of the area of the emission spectrum of the sensitizer B4. A wavelength corresponding to the emission spectrum peak of the blue light-emitting device 210 is 460 nm, a wavelength corresponding to the transmittance peak of the CLC film layer is 461 nm, and the absolute value of the difference between the two is 1 nm.

The comparison of the parameters in Embodiment 2, Embodiment 3 and Embodiment 4 is detailed in Table 4.

TABLE 4

| | Difference of the energy level of the sensitizer (eV) | Proportion of overlapping area |
|---|---|---|
| Embodiment 2 | 0.22 | 14.6% |
| Embodiment 3 | 0.22 | 19.3% |
| Embodiment 4 | 0.12 | 20.0% |

In Table 4, "Difference of the energy level of the sensitizer (eV)" represents the difference between the singlet energy level of the sensitizer and the triplet energy level of the sensitizer; "Proportion of overlapping area" represents a proportion of the overlapping area between the absorption spectrum of the second guest material and the emission spectrum of the sensitizer to the area of the emission spectrum of the sensitizer.

Referring to the parameters of Embodiment 2, Embodiment 3 and Embodiment 4 in Table 4, the performance of the light-emitting substrates 1000 respectively corresponding to Embodiment 2, Embodiment 3 and Embodiment 4 is tested at the same operating condition of luminance (e.g., 1000 nit), and the test result data are detailed in Table 5.

TABLE 5

| | Vol. | CE |
|---|---|---|
| Embodiment 2 | 100% | 100% |
| Embodiment 3 | 99% | 102% |
| Embodiment 4 | 98% | 105% |

In Table 5, "Vol." represents the driving voltage of the blue light-emitting device 210; "CE" represents the current luminous efficiency of the blue light-emitting device 210.

Referring to the parameters in Embodiment 2, Embodiment 3 and Embodiment 4, and based on the data in Table 4 and Table 5, it can be seen that under the same operating condition of luminance, compared with the blue light-emitting device 210 in Embodiment 2, for the blue light-emitting device 210 in Embodiment 3 and Embodiment 4, the driving voltage is reduced and the current luminous efficiency is improved. It can be understood that, limiting the difference between the singlet energy level of the sensitizer and the triplet energy level of the sensitizer to a small range is conducive to convert the triplet excitons of the sensitizer into the singlet excitons through the reverse intersystem crossing process, which improves the utilization rate of excitons in the blue-emitting layer 21, thereby improving the luminous efficiency of the blue-emitting layer 21. Moreover, the larger the overlapping area between the absorption spectrum of the second guest material and the emission spectrum of the sensitizer, the more conducive it is to transfer the exciton energy on the sensitizer to the second guest material, which may improve the luminous efficiency of the second guest material, thereby improving the luminous efficiency of the blue light-emitting layer 21. Furthermore, the luminous efficiency of the blue light-emitting device 210 may be improved, and the driving voltage of the blue light-emitting device 210 may be reduced on a basis of the improvement of the luminous efficiency.

Embodiment 5: the structure and material of the blue light-emitting layer 21 are respectively the same as those of the blue light-emitting layer 21 in Embodiment 2, and the light extraction member 300 adopts a CLC film layer D2. The wavelength corresponding to the emission spectrum peak of the blue light-emitting device 210 is 460 nm, the wavelength corresponding to the transmittance peak of the CLC film layer is 463 nm, and the absolute value of the difference between the two is 3 nm.

Comparative example 3: the structure and material of the blue light-emitting layer 21 are respectively the same as those of the blue light-emitting layer 21 in Embodiment 2, and the light extraction member 300 adopts a CLC film layer D3. The wavelength corresponding to the emission spectrum peak of the blue light-emitting device 210 is 460 nm, the wavelength corresponding to the transmittance peak of the CLC film layer is 470 nm, and the absolute value of the difference between the two is 10 nm.

FIG. 19 is a comparison diagram between the transmittance curve of each CLC film layer and the emission spectrum of the blue light-emitting device 210 in Embodiment 2, Embodiment 5 and Comparative example 3.

With reference to the parameters in Embodiment 2, Embodiment 5 and Comparative example 3, the performance of the light-emitting substrates 1000 respectively corresponding to Embodiment 2, Embodiment 5 and Comparative example 3 is tested at the same operating condition of luminance (e.g., 1000 nit), and the test result data are detailed in Table 6.

TABLE 6

| | Vol. | CE |
|---|---|---|
| Embodiment 2 | 100% | 100% |
| Embodiment 5 | 101% | 99% |
| Comparative example 3 | 103% | 96% |

In Table 6, "Vol." represents the driving voltage of the blue light-emitting device 210; "CE" represents the current luminous efficiency of the blue light-emitting device 210.

Referring to the parameters in Embodiment 2, Embodiment 5 and Comparative example 3, and based on the data in Table 6, it can be seen that, under the same operating condition of luminance, compared with the blue light-emitting device 210 in Comparative example 3, for the blue light-emitting device 210 in Embodiment 2 and Embodiment 5, the driving voltage is reduced and the current luminous efficiency is improved. It will be understood that, the less the difference between the wavelength corresponding to the transmittance peak of the light extraction member 300 and the wavelength corresponding to the emission spectrum peak of the blue light-emitting device 210, i.e., the closer the transmittance peak of the light extraction member 300 is to the emission spectrum peak of the blue light-emitting device 210, the more the amount of the blue light emitted from the blue light-emitting device 210 transmits the light extraction element 300, and the higher the light extraction efficiency of the blue light-emitting device 210. On the basis of improving the luminous efficiency, the driving voltage of the blue light-emitting device 210 may be reduced.

To sum up, in the light-emitting substrate 1000 and the display apparatus 3000 provided by the embodiments of the present disclosure, the light emitted from the blue light-emitting layer 21 may transmit the second electrode CE to enter the first light enhancement layer 220. The refractive index of the first light enhancement layer 220 is relatively large, which may increase the amount of light emitted from the blue light-emitting layer 21, thereby improving the luminous efficiency and display effect of the light-emitting substrate 1000 and the display apparatus 3000. Secondly, the light transmitting the first light enhancement layer 220 may enter the second light enhancement layer 230, and the light transmitting the first light enhancement layer 220 is sequentially constrained by the first inorganic layer 24 with a larger refractive index, the organic layer 25 with a smaller refractive index, and the third layer with a larger refractive index, which may reduce the influence of blue light on the color shift phenomenon in a large viewing angle, thereby further improving the display effect of the light-emitting substrate 1000 and the display apparatus 3000. Then, the light transmitting the second light enhancement layer 230 may pass through the light extraction element 300 to be emitted to the outside of the display apparatus 3000, by limiting the difference between the wavelength corresponding to the transmittance peak of the light extraction member 300 and the wavelength corresponding to the emission spectrum peak of the blue light-emitting device 210, the transmittance peak of the light extraction member 300 may be closer to the emission spectrum peak of the blue light-emitting device 210, so that the more blue light emitted from the blue light-emitting device 210 may transmit the light extraction element 300, so as to further improve the luminous efficiency of the light-emitting substrate 1000 and the display apparatus 3000. In short, the light emitted from the blue light-emitting layer 21 sequentially enters the first light enhancement layer 220, the second light enhancement layer 230 and the light extraction member 300, which can increase the amount of blue light emitted from the blue emitting layer 21 three times, so that the luminous efficiency and display effect of the light-emitting substrate 1000 and the display apparatus 3000 may be improved multiple times.

In this way, on the basis of improving the luminous efficiency of the blue light-emitting layer 210, the operating load of the blue light-emitting device 210 may be reduced, thereby extending the service life of the blue light-emitting device 210, and also reducing the probability that the red light-emitting device and/or the green light-emitting device adjacent to the blue light-emitting device 210 is lit up. Thus, the color display effect of the light-emitting substrate 1000 and the display apparatus 3000 is improved.

Figure 20:
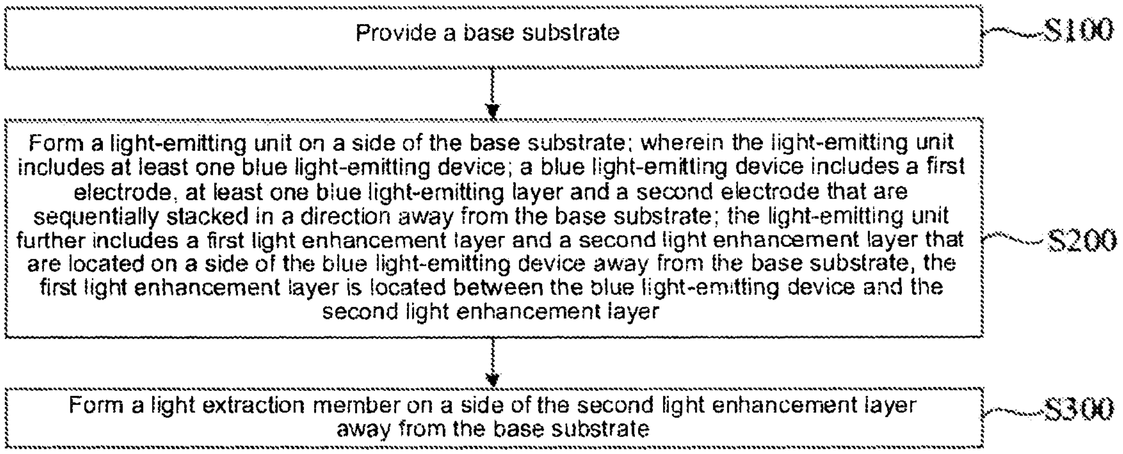
FIG. 20 is a flow diagram of a manufacturing method for a light-emitting substrate, in accordance with some embodiments.
Figure 21:
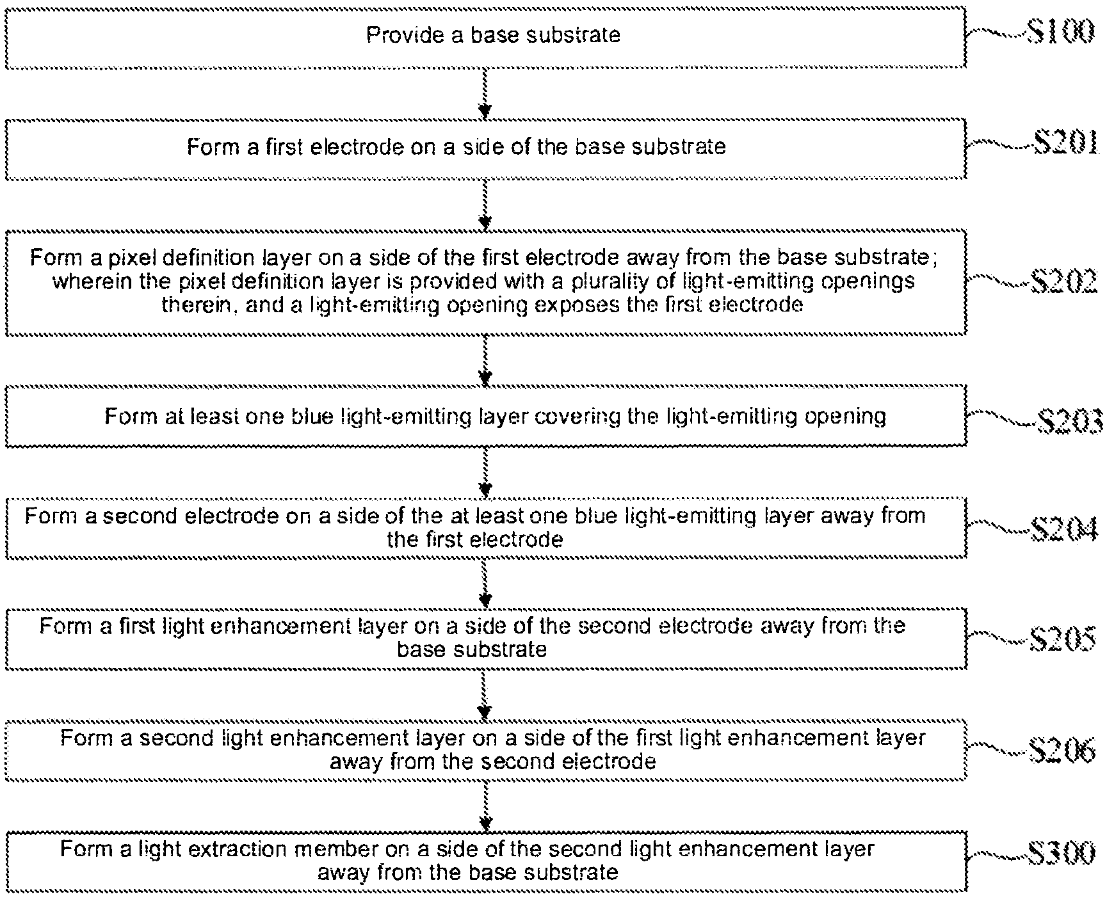
FIG. 21 is a flow diagram of a manufacturing method for a light-emitting substrate, in accordance with some embodiments.

FIGS. 20 and 21 are flow diagrams of a manufacturing method for a light-emitting substrate, in accordance with some embodiments.

As shown in FIG. 20, embodiments of the present disclosure provide a manufacturing method for a light-emitting substrate 1000. The light-emitting substrate 1000 is a top-emission light-emitting substrate 1000. The manufacturing method may include steps S100 to S300.

In step S100, a base substrate 100 is provided.

As shown in FIG. 3 and FIGS. 9A to 9C, the base substrate 100 in the step S100 may include a first sub-pixel region P1, a second sub-pixel region P2 and a third sub-pixel region P3. The first sub-pixel region P1, the second sub-pixel region P2 and the third sub-pixel region P3 have been described above in detail, and will not be repeated here.

The base substrate 100 may be a rigid base substrate or a flexible base substrate. For example, the material of the base substrate 100 may be polyethylene terephthalate (PET), polyimide (PI), cyclo olefin polymer (COP), or the like.

The step S100 may include: forming a pixel circuit layer on the base substrate 100. The pixel circuit layer includes a plurality of pixel circuits. As shown in FIGS. 9A to 9C, in a pixel unit region PU, multiple pixel circuits include a first pixel circuit S1, a second pixel circuit S2, and a third pixel circuit S3. For example, the first pixel circuit S1 is located in the first sub-pixel region P1, the second pixel circuit S2 is located in the second sub-pixel region P2, and the third pixel circuit S3 is located in the third sub-pixel region P3. The first pixel circuit S1 is configured to drive the blue light-emitting device 210, the second pixel circuit S2 is configured to drive the green light-emitting device, and the third pixel circuit S3 is configured to drive the red light-emitting device. The plurality of pixel circuits have been described above in detail, and will not be repeated here.

After forming the plurality of pixel circuits, an insulating layer INL covering the plurality of pixel circuits is formed.

The insulating layer INL may be located on the first pixel circuit S1, the second pixel circuit S2 and the third pixel circuit S3. The insulating layer INL may have a flat surface. The insulating layer INL may be formed from an organic layer by means of coating. For example, a material of the insulating layer INL may include acrylic resin, epoxy resin, imide resin or ester resin. The insulating layer INL may have through holes for exposing electrodes of the first pixel circuit S1, the second pixel circuit S2 and the third pixel circuit S3, so as to achieve electrical connection.

In step S200, a light-emitting unit 200 is formed on a side of the base substrate 100. The light-emitting unit 200 includes at least one blue light-emitting device 210. The blue light-emitting device 210 includes a first electrode AE, at least one blue light-emitting layer 21 and a second electrode CE that are sequentially stacked in a direction away from the base substrate 100. The light-emitting unit 200 further includes a first light enhancement layer 220 and a second light enhancement layer 230 that are located on a side of the blue light-emitting device 210 away from the base substrate 100. The first light enhancement layer 220 is located between the blue light-emitting device 210 and the second light enhancement layer 230. The second light enhancement layer 230 includes a first inorganic layer 24, an organic layer 25 and a second inorganic layer 26 that are sequentially stacked in the direction in which the first light enhancement layer 220 is away from the base substrate 100. The refractive index of the organic layer 25 is less than the refractive index of the first inorganic layer 24 and less than the refractive index of the second inorganic layer 26.

As shown in FIG. 21, the step S200 may include steps S201 to S206.

In step S201, a first electrode AE is formed on a side of the base substrate 100.

The first electrode AE may be an anode. As show in FIG. 3, the anode may include a first anode AE1, a second anode AE2 and a third anode AE3. The first anode AE1 is located in the first sub-pixel region P1, the second anode AE2 is located in the second sub-pixel region P2, and the third anode AE3 is located in the third sub-pixel region P3.

In some examples, the first anode AE may be formed on the insulating layer INL through a single patterning process. For example, an anode material is evaporated on the insulating layer INL by using a mask, and the first anode AE1 located in the first sub-pixel region P1, the second anode AE2 located in the second sub-pixel region P1, and the third anode AE3 located in the third sub-pixel region P3 are formed at once through exposure, development and etching by using the mask.

The anode material may be a metal such as Ag, Mg, A1, Pt, Pd, Au, Ni, Nd, Ir or Cr and a mixture material thereof, or may be a conductive metal oxide material such as ITO, IZO or IGZO. For example, the anode includes a stacked composite structure including transparent conductive oxide/metal/transparent conductive oxide. The transparent conductive oxide material is, for example, ITO or IZO, and the metal material is, for example, Au, Ag, Ni or Pt. For example, the anode has a structure of ITO/Ag/ITO.

In step S202, a pixel definition layer PDL is formed on a side of the first electrode AE away from the base substrate 100; the pixel definition layer PDL is provided with a plurality of light-emitting openings therein, and a light-emitting opening exposes the first electrode AE.

As shown in FIGS. 9A to 9C, the pixel definition layer PDL may be formed on the insulating layer INL and the first electrode AE. For example, a pixel definition material layer covering the insulating layer and the anode AE is formed by using a deposition process, and a portion of pixel definition material layer is removed through an etching process to obtain the pixel definition layer PDL. The pixel definition layer PDL includes a first light-emitting opening K1 located in the first sub-pixel region P1, a second light-emitting opening K2 located in the second sub-pixel region P2, and a third light-emitting opening K3 located in the third sub-pixel region P3. The first light-emitting opening K1 exposes the first anode AE1, the second light-emitting opening K2 exposes the second anode AE2, and the third light-emitting opening K3 exposes the third anode AE3.

In step S203, at least one blue light-emitting layer 21 covering the light-emitting opening is formed.

For example, in step S203, a fine metal mask (FMM) may be used to form the blue light-emitting layer 21 covering the first light-emitting opening K1 at the first light-emitting opening K1. The number of blue light-emitting layers 21 may be one or more. For example, in step S203, a fine metal mask may be used to form two or three blue light-emitting layers 21 that are staked sequentially in a direction perpendicular to the base substrate 100 and covering the same first light-emitting opening K1 at the first light-emitting opening K1.

In some examples, the blue light-emitting layer 21 may adopt a blue phosphorescent luminescent material, and the blue light-emitting layer 21 may include a first host material and a first guest material.

In the blue light-emitting layer 21, a ratio of electron mobility of the first host material to hole mobility of the first host material is greater than or equal to 80, such as 80, 82, 86, 90, 92, 95, 98, 100, 110 or 120.

By limiting the ratio of the electron mobility of the first host material to the hole mobility of the first host material to a large range, i.e., by limiting the electron mobility of the first host material to be much greater than the hole mobility of the first host material, the electron transport rate of carriers is greater than the hole transport rate in the blue emitting layer 21, so that the first host material has good triplet exciton confinement ability to block excitons in the blue light-emitting layer 21 from transporting to the second electrode CE (i.e., the cathode). Thus, the excitons may be limited in the blue light-emitting layer 21, and the carrier balance may be ensured, thereby improving the luminous efficiency of the blue light-emitting layer 21.

For example, the first guest material may be a metal complex including any one of metal element iridium, platinum, palladium or cerium and at least two nitrogen heterocyclic carbene ligands. For example, the first guest material is a metal complex including metal element iridium and two nitrogen heterocyclic carbene ligands. As another example, the first guest material is a metal complex including metal element platinum and two nitrogen heterocyclic carbene ligands.

For example, the triplet energy level of the first host material is greater than the triplet energy level of the first guest material. A difference between the triplet energy level of the first host material and the triplet energy level of the first guest material is greater than or equal to 0.1 eV, such as 0.1 eV, 0.2 eV, 0.3 eV, 0.5 eV, 0.8 eV or 1 eV.

For example, in step S203, the first host material and the first guest material may be evaporated by using a heating device (e.g., a crucible), and a fine metal mask may be used to form the blue light-emitting layer 21 at the light-emitting opening.

In some other examples, the blue light-emitting layer 21 may adopt a blue super-fluorescent light-emitting material, and the blue light-emitting layer 21 may include a second host material, a sensitizer, and a second guest material.

In the blue light-emitting layer 21, a ratio of electron mobility of the second host material to hole mobility of the second host material is less than or equal to 0.2, such as 0.05, 0.1, 0.15 or 0.2.

By limiting the ratio of the electron mobility of the second host material to the hole mobility of the second host material to a small range, the electron transport performance and hole transport performance of the blue light-emitting layer 21 may be improved, so that the electrons and holes in the blue light-emitting layer 21 may be evenly distributed to ensure the carrier balance. Thus, the utilization rate of electrons and holes in the blue light-emitting layer 21 is improved, thereby improving the luminous efficiency of the blue light-emitting layer 21.

The sensitizer may be a thermally activated delayed fluorescent material, and has luminescent property. For example, the sensitizer may contain at least 1 carbazole group and at least 1 cyano group. For example, the sensitizer may include 2 carbazole groups and 1 cyano group. As another example, the sensitizer may include 4 carbazole groups and 1 cyano group. A ratio of electron mobility of the sensitizer to hole mobility of the sensitizer is greater than or equal to 8, such as 8, 10, 12, 15, or 20. An absolute value of a difference between the singlet energy level of the sensitizer and the triplet energy level of the sensitizer is less than or equal to 0.5 eV, such as 0.1 eV, 0.2 eV, 0.3 eV, 0.4 eV, or 0.5 eV.

As shown in FIG. 14, a proportion of an overlapping area S between an absorption spectrum of the second guest material and an emission spectrum of the sensitizer to an area A of the emission spectrum of the sensitizer is greater than or equal to 8%, such as 8%, 10%, 15%, 20%, 30% or 50%.

For example, in step S203, the second host material, the sensitizer and the second guest material may be evaporated by using a heating device (e.g., a crucible), and a fine metal mask is used to form the blue light-emitting layer 21 at the light-emitting opening.

In step S204, a second electrode CE is formed on a side of the at least one blue light-emitting layer 21 away from the first electrode AE.

As shown in FIG. 3, the second electrode CE covers the first light-emitting opening K1, the second light-emitting opening K2, the third light-emitting opening K3 and the pixel definition layer PDL, and a portion covering the pixel definition layer PDL and portions covering the light-emitting openings are constitute a continuous film.

The second electrode CE may be a cathode. In some examples, the second electrode CE may be formed by evaporating a cathode material on the side of the at least one blue light-emitting layer 21 away from the first electrode AE. The cathode material may include Ag, Mg, Cu, Al, Pt, Pd, Au, Ni, Nd, Ir, Cr, Li, Ca, LiF/Ca, LiF/Al, Mo or Ti, or a compound or a mixture thereof, such as a mixture of Ag and Mg.

In step S205, the first light enhancement layer 220 is formed on a side of the second electrode CE away from the base substrate 100.

The first light enhancement layer 220 may also be referred as a light extraction layer CPL or a light coupling layer. For example, as shown in FIG. 3, the first light enhancement layer 220 is located on a surface of the second electrode CE away from the blue light-emitting layer 21, which may be understood that the first light enhancement layer 220 may directly contact with the surface of the second electrode CE away from the blue light-emitting layer 21. For example, the step S205 includes forming the first light enhancement layer 220 by evaporating the first light enhancement layer material on the surface of the second electrode CE away from the blue light-emitting layer 21.

For example, the first light enhancement layer material may be an organic material, and refractive index of the first light enhancement layer 220 may be greater than or equal to 1.8, such as 1.8, 1.9, or 2.0.

Since the refractive index of the first light enhancement layer 220 is relatively large, the light emitted from the blue light-emitting layer 21 is refracted when transmitting through the first light enhancement layer 220; the refraction angle of the light is less than the incident angle of the light, so that the propagation direction of the light emitted from the blue light-emitting layer 21 deflects toward a direction perpendicular to the base substrate 100. Thus, it is possible to improve the amount of light emitted from the blue light-emitting layer 21, thereby improving the light extraction efficiency and display effect of the light-emitting substrate 1000 and the display apparatus 3000.

In step S206, the second light enhancement layer 230 is formed on a side of the first light enhancement layer 220 away from the second electrode CE.

In some examples, as shown in FIGS. 9A to 9C, step S206 may include: forming the first inorganic layer 24 on the side of the first light enhancement layer 220 away from the second electrode CE by chemical vapor deposition. After forming the first inorganic layer 24, the organic layer 25 is formed on a side of the first inorganic layer 24 away from the second electrode CE through an inkjet printing process, and the organic layer 25 has a flat surface. After forming the organic layer 25, the second inorganic layer 26 is formed on the flat surface of the organic layer 25 by chemical vapor deposition.

In some examples, the second light enhancement layer 230 may have the property of isolating moisture and oxygen, and the second light enhancement layer 230 is further configured to encapsulate the light-emitting devices in the light-emitting unit 200 and the first light enhancement layer 220. As shown in FIGS. 9A to 9C, the materials of the first inorganic layer 24 and the second inorganic layer 26 in the second light enhancement layer 230 may be selected from at least one of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride or lithium fluoride. The material of the organic layer 25 is at least one of acrylic resin, methacrylic resin, polyisoprene, vinyl resin, epoxy resin, polyurethane resin, cellulose resin or perylene resin. The number of layers, the material and structure of the film encapsulation layer may be varied by those skilled in the art according to requirements, which is not limited in the present disclosure.

The light emitted from the blue light-emitting layer 21 is sequentially constrained by the first inorganic layer 24 with a larger refractive index, the organic layer 25 with a smaller refractive index, and the second inorganic layer 26 with a larger refractive index, which may reduce the influence of blue light on the color shift phenomenon in a large viewing angle, thereby improving the display effect of the light-emitting substrate 1000.

In some other examples, as shown in FIGS. 9A and 9B, the second light enhancement layer 230 further includes a third inorganic layer 27. The third inorganic layer 27 may be disposed between the first light enhancement layer 220 and the first inorganic layer 24. Refractive index of the third inorganic layer 27 is less than the refractive index of the first light enhancement layer 220 and less than the refractive index of the first inorganic layer 24.

For example, the refractive index of the first light enhancement layer 220 is greater than or equal to 1.8 (e.g., 1.8, 1.9, or 2.0), and the refractive index of the third inorganic layer 27 is less than or equal to 1.5 (e.g., 1.3, 1.4, or 1.5), and the refractive index of the first inorganic layer 24 is also greater than or equal to 1.8 (e.g., 1.8, 1.9 or 2.0).

For example, step S206 may further include: forming the third inorganic layer 27 on a side of the first light enhancement layer 220 away from the second electrode CE by chemical vapor deposition. After forming the third inorganic layer 27, the first inorganic layer 24, the organic layer 25 and the second inorganic layer 26 are sequentially formed according to the method in the above examples, which will not be repeated here.

The light emitted from the blue light-emitting layer 21 is sequentially constrained by the first inorganic layer 220 with a larger refractive index, the organic layer 27 with a smaller refractive index, and the second inorganic layer 24 with a larger refractive index, which may reduce the influence of blue light on the color shift phenomenon in a large viewing angle, thereby improving the display effect of the light-emitting substrate 1000 and the display apparatus.

In step S300, a light extraction member 300 is formed on a side of the second light enhancement layer 230 away from the base substrate 100.

An orthographic projection of the light extraction member 300 on the base substrate 100 at least partially overlaps with an orthographic projection of the blue light-emitting device 210 on the base substrate 100.

For example, in step S300, the light extraction member 300 may be bonded to the surface of the second light enhancement layer 230 away from the base substrate 100 by the optical transparent adhesive.

As shown in FIGS. 9A to 9C, the blue light-emitting device 210 covers the first light-emitting opening K1, the green light-emitting device covers the second light-emitting opening K2, and the red light-emitting device covers the third light-emitting opening K3.

In some examples, as shown in FIG. 9A, the light extraction member 300 may be of a patterned structure, and the orthographic projection of the light extraction member 300 on the base substrate 100 may only cover part of an orthographic projection of a light-emitting portion of the blue light-emitting device 210 on the base substrate 100. The light extraction member 300 exposes the green light-emitting device and the red light-emitting device.

In step S300, on the surface of the second inorganic layer 26 away from the base substrate 100, the light extraction member 300 may be bonded only in a region corresponding to the first light-emitting opening K1 by the optical transparent adhesive to form a light extraction member 300 whose orthographic projection on the base substrate 100 only covering part of the orthographic projection of the light-emitting portion of the blue light-emitting device 210 on the base substrate 100. Other parts (including regions corresponding to the second light-emitting opening K2 and corresponding to the third light-emitting opening K3) of the light-emitting substrate 1000 that are in the same layer as the light extraction member 300 with a patterned structure may be made into a flat surface by a manner of filling the optical clear adhesive, which facilitates the manufacturing of components in subsequent processes.

In some examples, as shown in FIG. 9B, the light extraction member 300 may be of a patterned structure, and the orthographic projection of the light extraction member 300 on the base substrate 100 may completely overlaps with the orthographic projection of the light-emitting portion of the blue light-emitting device 210 on the base substrate 100. The light extraction member 300 exposes the green light-emitting device and the red light-emitting device.

In step S300, on the surface of the second inorganic layer 26 away from the base substrate 100, the light extraction member 300 may be bonded on a position corresponding to the blue light-emitting device 210 by the optical clear adhesive to form the light extraction member 300 whose orthographic projection on the base substrate 100 completely covering the orthographic projection of the light-emitting portion of the blue light-emitting device 210 on the base substrate 100. In the light-emitting substrate 1000, other parts (including regions corresponding to the second light-emitting opening K2 and corresponding to the third light-emitting opening K3) that are in the same layer as the light extraction member 300 with a patterned structure may be made into a flat surface by a manner of filling the optical clear adhesive, which facilitates the manufacturing of components in subsequent processes.

In some examples, as shown in FIG. 9C, the light extraction member 300 may be of a whole-layer structure, and the orthographic projection of the light extraction member 300 on the base substrate 100 may cover the orthographic projection of the blue light-emitting device 210 on the base substrate 100, an orthographic projection of the green light-emitting device on the base substrate 100, and an orthographic projection of the red light-emitting device on the base substrate 100, and further cover an orthographic projection of the film connected between the blue light-emitting device 210, the green light-emitting device and the red light-emitting device on the base substrate 100.

In step S300, the entire layer of light extraction member 300 may be directly bonded to the surface of the second inorganic layer 26 away from the base substrate 100 by the optical clear adhesive.

The light emitted from the blue light-emitting layer 21 may enter the light extraction member 300, so that the propagation direction of the light emitted from the blue light-emitting layer 21 deflects toward a direction perpendicular to the base substrate 100. Thus, it is possible to improve the light extraction efficiency of the partial region of the blue light-emitting layer 21 corresponding to the light extraction member 300.

An absolute value of a difference between a wavelength corresponding to a transmittance peak of the light extraction member 300 and a wavelength corresponding to an emission spectrum peak of the blue light-emitting device 210 is less than or equal to 10 nm, such as 10 nm, 9 nm, 8 nm, 6 nm, 5 nm, 4 nm or 3 nm. Limiting the difference between the wavelength corresponding to the transmittance peak of the light extraction member 300 and the wavelength corresponding to the emission spectrum peak of the blue light-emitting device 210 may be understood as making the transmittance peak of the light extraction member 300 closer to the emission spectral peak of the blue light-emitting device 210, which may increase the amount of the blue light emitted from the blue light-emitting device 210 transmitting the light extraction member 300, thereby improving the light extraction efficiency of the blue light-emitting device 210.

In some examples, the light extraction member 300 may be a cholesteric liquid crystal film layer.

In some examples, as shown in FIG. 3 and FIGS. 9A to 9C, after step S300, forming an anti-reflection layer 400 on a side of the light extraction member 300 away from the second light enhancement layer 230 may be further included. For example, the anti-reflection layer 400 is a polarizer or a filter film, and the polarizer or filter film is bonded to the side of the light extraction member 300 away from the second light enhancement layer 230 by the optical clear adhesive. The light emitted from the blue light-emitting layer 21 transmits the light extraction member 300 first, and then enters the anti-reflection layer 400. The anti-reflection layer 400 may make the light polarized to reduce or even inhibit the reflection of the light and to enhance the transmission of the light, so that the light further deflects towards the direction perpendicular to the base substrate 100, and thus the display effect of the light-emitting substrate 1000 may be improved.

As has been described in detail above, the light-emitting substrate and display apparatus provided by the embodiments of the present disclosure have the beneficial effects of high overall luminous efficiency, low operating load, long effective service life, and good display effect. Therefore, on the basis of manufacturing the light-emitting substrate and the display apparatus by using the manufacturing method for the light-emitting substrate provided by the embodiments of the present disclosure, the beneficial effects of the light-emitting substrate and the display apparatus may also be obtained, which will not be repeated here.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A light-emitting substrate being a top-emission light-emitting substrate, the light-emitting substrate comprising:

a base substrate;

a light-emitting unit located on a side of the base substrate; the light-emitting unit comprising: at least one blue light-emitting device, wherein a blue light-emitting device comprises a first electrode, at least one blue light-emitting layer and a second electrode that are sequentially stacked in a direction away from the base substrate; and a first light enhancement layer and a second light enhancement layer that are located on a side of the blue light-emitting device away from the base substrate; the first light enhancement layer being located between the blue light-emitting device and the second light enhancement layer; wherein the second light enhancement layer comprises a first inorganic layer, an organic layer and a second inorganic layer that are sequentially stacked in a direction wherein the first light enhancement layer is away from the base substrate, and refractive index of the organic layer is less than refractive index of the first inorganic layer and less than refractive index of the second inorganic layer; and a light extraction member located on a side of the second light enhancement layer away from the base substrate, wherein an orthographic projection of the light extraction member on the base substrate at least partially overlaps with an orthographic projection of the blue light-emitting device on the base substrate;

wherein an absolute value of a difference between a wavelength corresponding to a transmittance peak of the light extraction member and a wavelength corresponding to an emission spectrum peak of the blue light-emitting device is less than or equal to 10 nm.

2. The light-emitting substrate according to claim 1, wherein the absolute value of the difference between the wavelength corresponding to the transmittance peak of the light extraction member and the wavelength corresponding to the emission spectrum peak of the blue light-emitting device is less than or equal to 3 nm.

3. The light-emitting substrate according to claim 1, wherein the orthographic projection of the light extraction member on the base substrate covers an orthographic projection of a light-emitting portion of the blue light-emitting device on the base substrate.

4. The light-emitting substrate according to claim 1, wherein the light extraction member is a cholesteric liquid crystal film layer.

5. The light-emitting substrate according to claim 1, wherein the second light enhancement layer further comprises a third inorganic layer; the third inorganic layer is disposed between the first light enhancement layer and the first inorganic layer; refractive index of the third inorganic layer is less than refractive index of the first light enhancement layer and less than the refractive index of the first inorganic layer.

6. The light-emitting substrate according to claim 1, wherein a blue light-emitting layer comprises a first host material and a first guest material;

in the blue light-emitting layer, a ratio of electron mobility of the first host material to hole mobility of the first host material is greater than or equal to 80.

7. The light-emitting substrate according to claim 6, wherein the first guest material is a metal complex comprising any one of metal element iridium, platinum, palladium or cerium and at least two nitrogen heterocyclic carbene ligands.

8. The light-emitting substrate according to claim 6, wherein in the blue light-emitting layer, triplet energy level of the first host material is greater than triplet energy level of the first guest material.

9. The light-emitting substrate according to claim 1, wherein a blue light-emitting layer comprises a second host material, a sensitizer and a second guest material; wherein in the blue light-emitting layer, a ratio of electron mobility of the second host material to hole mobility of the second host material is less than or equal to 0.2.

10. The light-emitting substrate according to claim 9, wherein a ratio of electron mobility of the sensitizer to hole mobility of the sensitizer is greater than or equal to 8.

11. The light-emitting substrate according to claim 9, wherein an absolute value of a difference between singlet energy level of the sensitizer and triplet energy level of the sensitizer is less than or equal to 0.5 eV.

12. The light-emitting substrate according to claim 9, wherein a proportion of a weight of the sensitizer to a sum of a weight of the second host material and the weight of the sensitizer is less than or equal to 30%.

13. The light-emitting substrate according to claim 9, wherein a ratio of a weight of the second guest material to a sum of a weight of the second host material and a weight of the sensitizer is less than or equal to 5%.

14. The light-emitting substrate according to claim 9, wherein a proportion of an overlapping area between an absorption spectrum of the second guest material and an emission spectrum of the sensitizer to an area of the emission spectrum of the sensitizer is greater than or equal to 8%.

15. The light-emitting substrate according to claim 9, wherein a proportion of an overlapping area between an absorption spectrum of the second guest material and an emission spectrum of the sensitizer to an area of the emission spectrum of the sensitizer is less than or equal to 80%.

16. The light-emitting substrate according to claim 9, wherein the second guest material is selected from any one of structures represented by the following general formula:

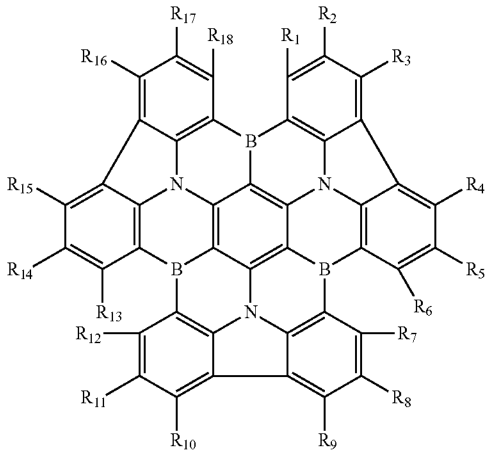

wherein substituent groups $R_1$ to $R_{18}$ are the same or different, and are independently selected from any one of hydrogen, alkyl, aryl or heteroaryl; adjacent substituent groups $R_1$ to $R_{18}$ form a fused ring or form no fused ring.

17. The light-emitting substrate according to claim 1, wherein the wavelength corresponding to the emission spectrum peak of the blue light-emitting device is in a range of 440 nm to 480 nm, inclusive, and full width at half maximum of the emission spectrum of the blue light-emitting device is less than or equal to 50 nm.

18. The light-emitting substrate according to claim 1, further comprising: an anti-reflection layer disposed on a side of the light extraction member away from the base substrate.

19. A manufacturing method for a light-emitting substrate, the light-emitting substrate being a top-emission light-emitting substrate, the manufacturing method comprising:

providing a base substrate;

forming a light-emitting unit on a side of the base substrate; wherein the light-emitting unit comprises at least one blue light-emitting device; a blue light-emitting device comprises a first electrode, at least one blue light-emitting layer and a second electrode that are sequentially stacked in a direction away from the base substrate; the light-emitting unit further comprises rises a first light enhancement layer and a second light enhancement layer that are located on a side of the blue light-emitting device away from the base substrate, the first light enhancement layer is located between the blue light-emitting device and the second light enhancement layer; the second light enhancement layer comprises a first inorganic layer, an organic layer and a second inorganic layer that are sequentially stacked in a direction wherein the first light enhancement layer is away from the base substrate, and refractive index of the organic layer is less than refractive index of the first inorganic layer and less than refractive index of the second inorganic layer; and forming a light extraction member on a side of the second light enhancement layer away from the base substrate; wherein an orthographic projection of the light extraction member on the base substrate at least partially overlaps with an orthographic projection of the blue light-emitting device on the base substrate, and an absolute value of a difference between a wavelength corresponding to a transmittance peak of the light extraction member and a wavelength corresponding to an emission spectrum peak of the blue light-emitting device is less than or equal to 10 nm.

20. A display apparatus, comprising:

a circuit board; and the light-emitting substrate according to claim 1, wherein the light-emitting substrate is coupled to the circuit board.

* * * * *